US012648220B2

(12) United States Patent
Wu et al.

(10) Patent No.: US 12,648,220 B2
(45) Date of Patent: Jun. 2, 2026

(54) TRANSISTOR SOURCE/DRAIN CONTACTS AND METHODS OF FORMING THE SAME

(71) Applicant: Taiwan Semiconductor Manufacturing Co., Ltd., Hsinchu (TW)

(72) Inventors: Yang-Cheng Wu, Hsinchu (TW); Yun-Hua Chen, Zhubei City (TW); Wen-Kuo Hsieh, Taipei City (TW); Huan-Just Lin, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 110 days.

(21) Appl. No.: 18/359,342

(22) Filed: Jul. 26, 2023

(65) Prior Publication Data

US 2023/0369325 A1     Nov. 16, 2023

Related U.S. Application Data

(63) Continuation of application No. 17/339,452, filed on Jun. 4, 2021, now Pat. No. 11,798,943.

(60) Provisional application No. 63/150,745, filed on Feb. 18, 2021.

(51) Int. Cl.
| | |
|---|---|
| *H10D 84/83* | (2025.01) |
| *H10D 30/01* | (2025.01) |
| *H10D 30/62* | (2025.01) |
| *H10D 62/13* | (2025.01) |
| *H10D 84/01* | (2025.01) |

(Continued)

(52) U.S. Cl.
CPC ......... *H10D 84/834* (2025.01); *H10D 30/024* (2025.01); *H10D 30/6211* (2025.01); *H10D 62/149* (2025.01); *H10D 84/013* (2025.01); *H10D 84/0158* (2025.01); *H10D 84/038* (2025.01); *H10P 50/644* (2026.01)

(58) Field of Classification Search
None
See application file for complete search history.

(56) References Cited

U.S. PATENT DOCUMENTS

| | | | |
|---|---|---|---|
| 5,447,875 | A | 9/1995 | Moslehi |
| 9,105,490 | B2 | 8/2015 | Wang et al. |
| 9,236,267 | B2 | 1/2016 | De et al. |

(Continued)

FOREIGN PATENT DOCUMENTS

| | | |
|---|---|---|
| CN | 107039507 A | 8/2017 |
| CN | 108231689 A | 6/2018 |

(Continued)

*Primary Examiner* — Shahed Ahmed
*Assistant Examiner* — Lamont B Koo
(74) *Attorney, Agent, or Firm* — Slater Matsil, LLP

(57)     ABSTRACT

In an embodiment, a method includes: depositing a protective layer on a source/drain region and a gate mask, the gate mask disposed on a gate structure, the gate structure disposed on a channel region of a substrate, the channel region adjoining the source/drain region; etching an opening through the protective layer, the opening exposing the source/drain region; depositing a metal in the opening and on the protective layer; annealing the metal to form a metal-semiconductor alloy region on the source/drain region; and removing residue of the metal from the opening with a cleaning process, the protective layer covering the gate mask during the cleaning process.

20 Claims, 22 Drawing Sheets

(51) Int. Cl.
    *H10D 84/03*        (2025.01)
    *H10P 50/64*        (2026.01)

(56)           References Cited

U.S. PATENT DOCUMENTS

| | | |
|---|---|---|
| 9,236,300 B2 | 1/2016 | Liaw |
| 9,324,820 B1 | 4/2016 | Kelly et al. |
| 9,406,804 B2 | 8/2016 | Huang et al. |
| 9,443,769 B2 | 9/2016 | Wang et al. |
| 9,520,482 B1 | 12/2016 | Chang et al. |
| 9,536,980 B1 | 1/2017 | Huang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 9,997,412 B1 | 6/2018 | Bae et al. |

| | | | |
|---|---|---|---|
| 10,297,601 B2 | 5/2019 | Kim et al. | |
| 10,734,233 B2 | 8/2020 | Zang et al. | |
| 2013/0171795 A1* | 7/2013 | Pei | H10D 62/021 |
| | | | 438/303 |
| 2015/0303118 A1* | 10/2015 | Wang | H10D 84/0151 |
| | | | 257/401 |
| 2017/0288031 A1* | 10/2017 | Ho | H10D 84/0149 |
| 2019/0122920 A1* | 4/2019 | Su | H10D 64/256 |
| 2019/0371898 A1 | 12/2019 | Huang | |

FOREIGN PATENT DOCUMENTS

| | | |
|---|---|---|
| CN | 110556417 A | 12/2019 |
| CN | 111554578 A | 8/2020 |
| DE | 102019200725 A1 | 8/2019 |
| JP | H09321280 A | 12/1997 |
| KR | 20180066940 A | 6/2018 |

* cited by examiner

TRANSISTOR SOURCE/DRAIN CONTACTS AND METHODS OF FORMING THE SAME

PRIORITY CLAIM AND CROSS-REFERENCE

This application is a continuation of U.S. patent application Ser. No. 17/339,452, filed on Jun. 4, 2021, entitled "Transistor Source/Drain Contacts and Methods of Forming the Same," which claims the benefit of U.S. Provisional Application No. 63/150,745, filed on Feb. 18, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-21B are views of intermediate stages in the manufacturing of FinFETs, in accordance with some embodiments.

DETAILED DESCRIPTION

Figure 1:
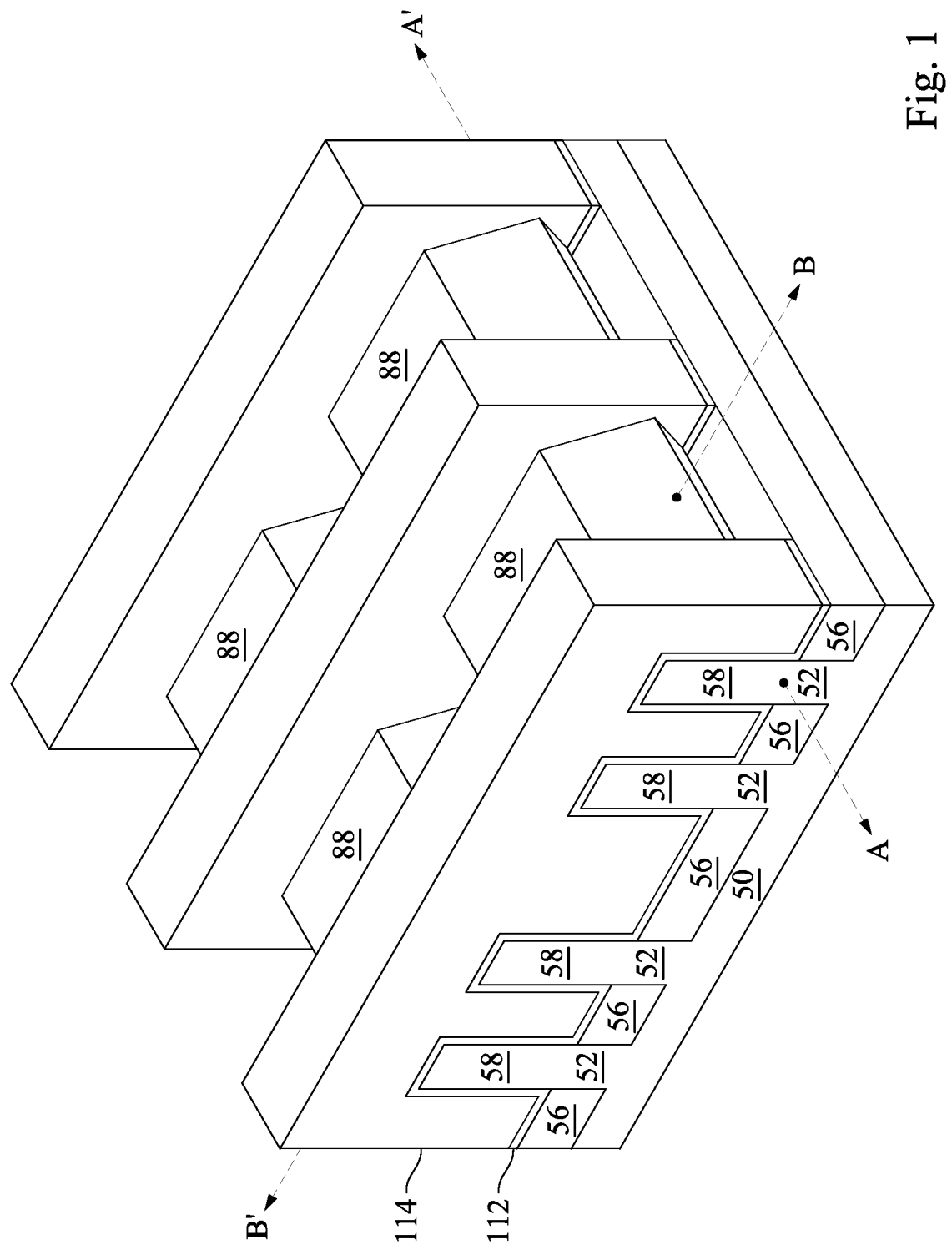
FIG. 1 illustrates an example of a fin field-effect transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, contact openings to source/drain regions are initially formed to a smaller width and then expanded to a larger width in a separate etching process. The widths of the contact openings may be better controlled, thus can avoiding shorting of adjacent source/drain regions. Additionally, a protective layer is formed in the contact openings and used to protect surrounding features during the formation of metal-semiconductor alloy regions on the source/drain regions. Manufacturing yield may thus be improved.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending from a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials. In this context, the fins 52 refer to the portion extending from between the adjacent isolation regions 56.

Gate dielectrics 112 are along sidewalls and over top surfaces of the fins 52. Gate electrodes 114 are over the gate dielectrics 112. Epitaxial source/drain regions 88 are disposed in opposite sides of the fin 52 with respect to the gate dielectrics 112 and gate electrodes 114. The epitaxial source/drain regions 88 may be shared between various fins 52. For example, adjacent epitaxial source/drain regions 88 may be electrically connected, such as through coalescing the epitaxial source/drain regions 88 by epitaxial growth, or through coupling the epitaxial source/drain regions 88 with a same source/drain contact.

FIG. 1 further illustrates reference cross-sections that are used in later figures. Cross-section A-A' is along a longitudinal axis of a fin 52 and in a direction of, for example, a current flow between the epitaxial source/drain regions 88 of a FinFET. Cross-section B-B' is perpendicular to cross-section A-A' and extends through epitaxial source/drain regions 88 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
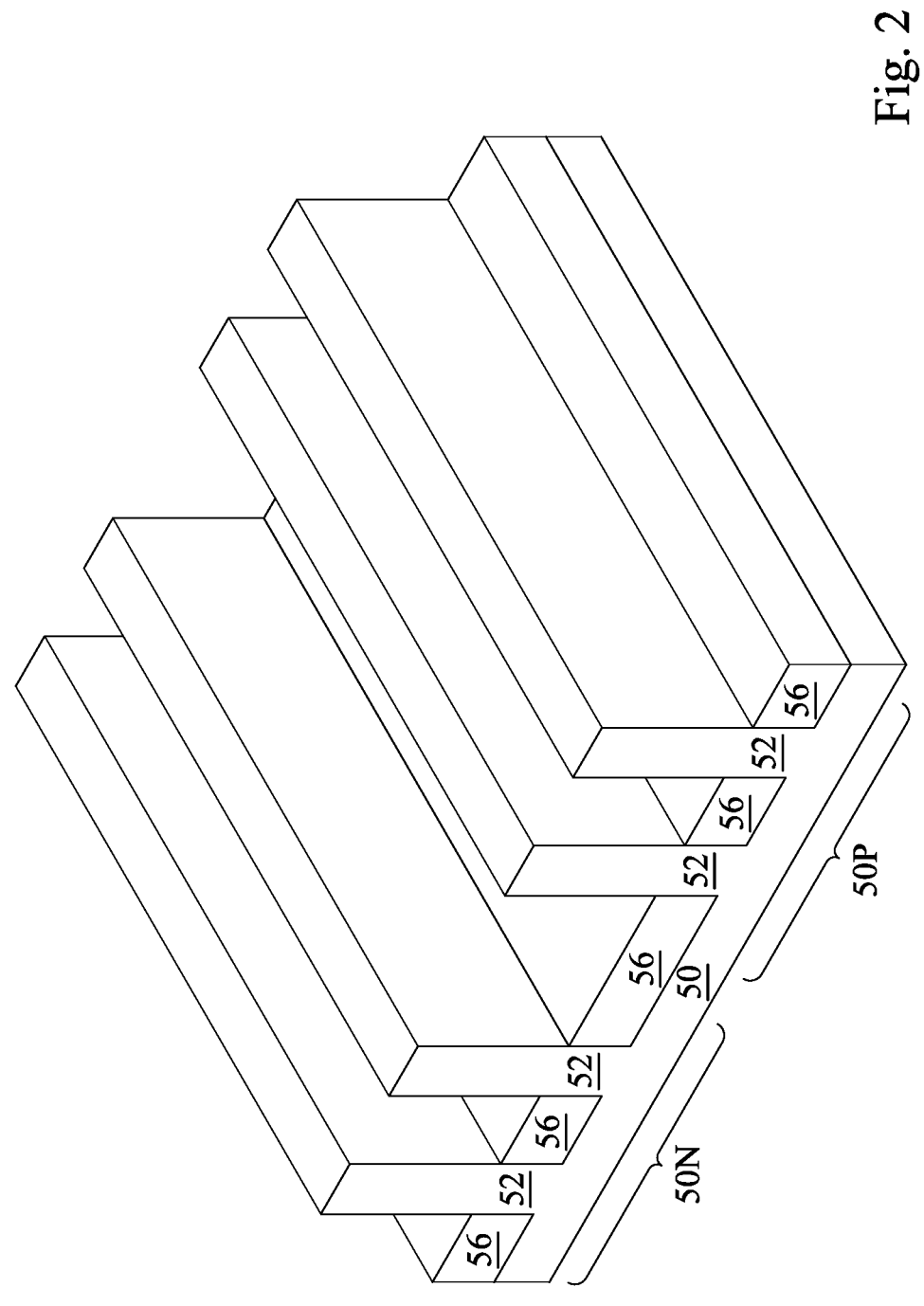
Figure 3:
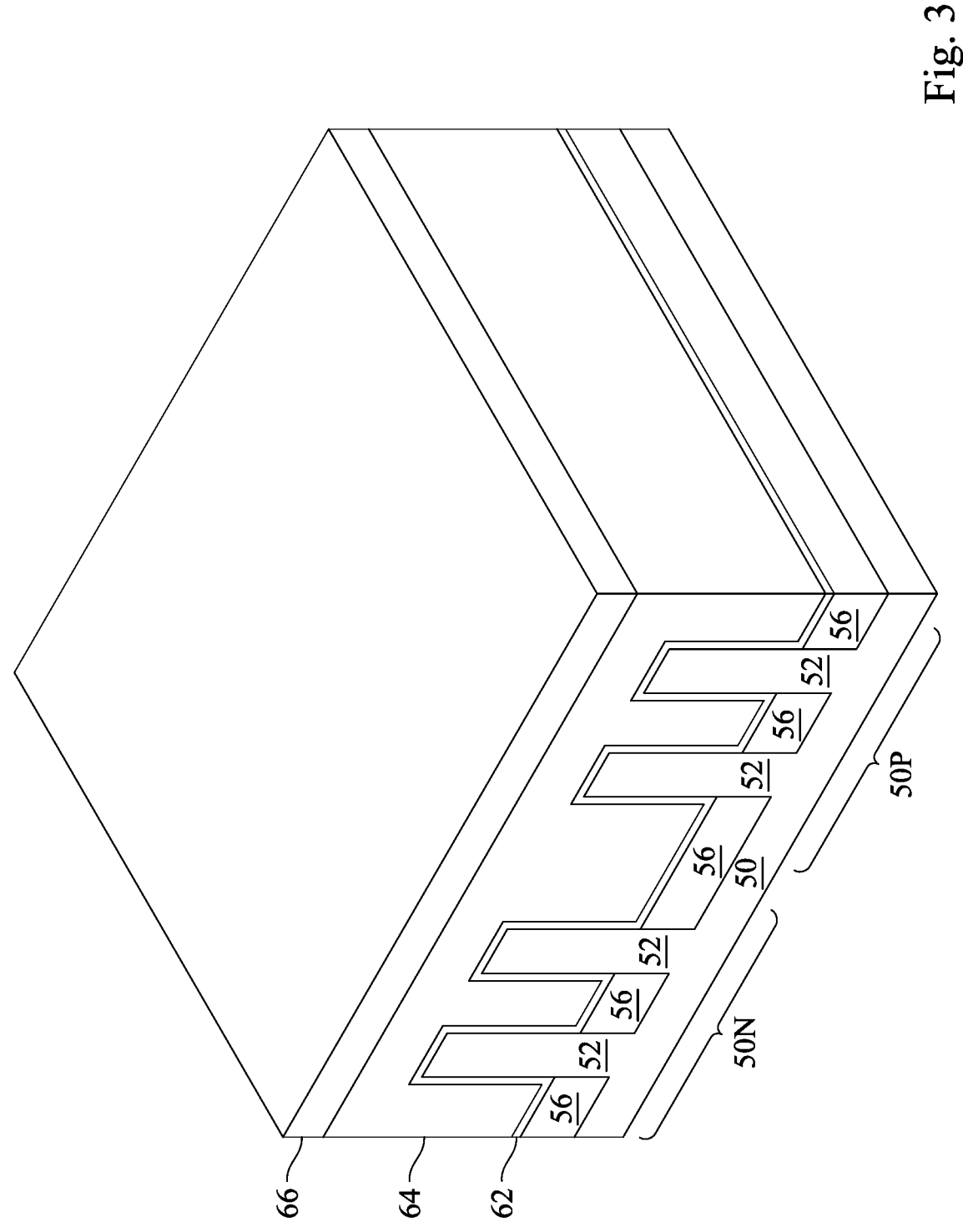
Figure 4:
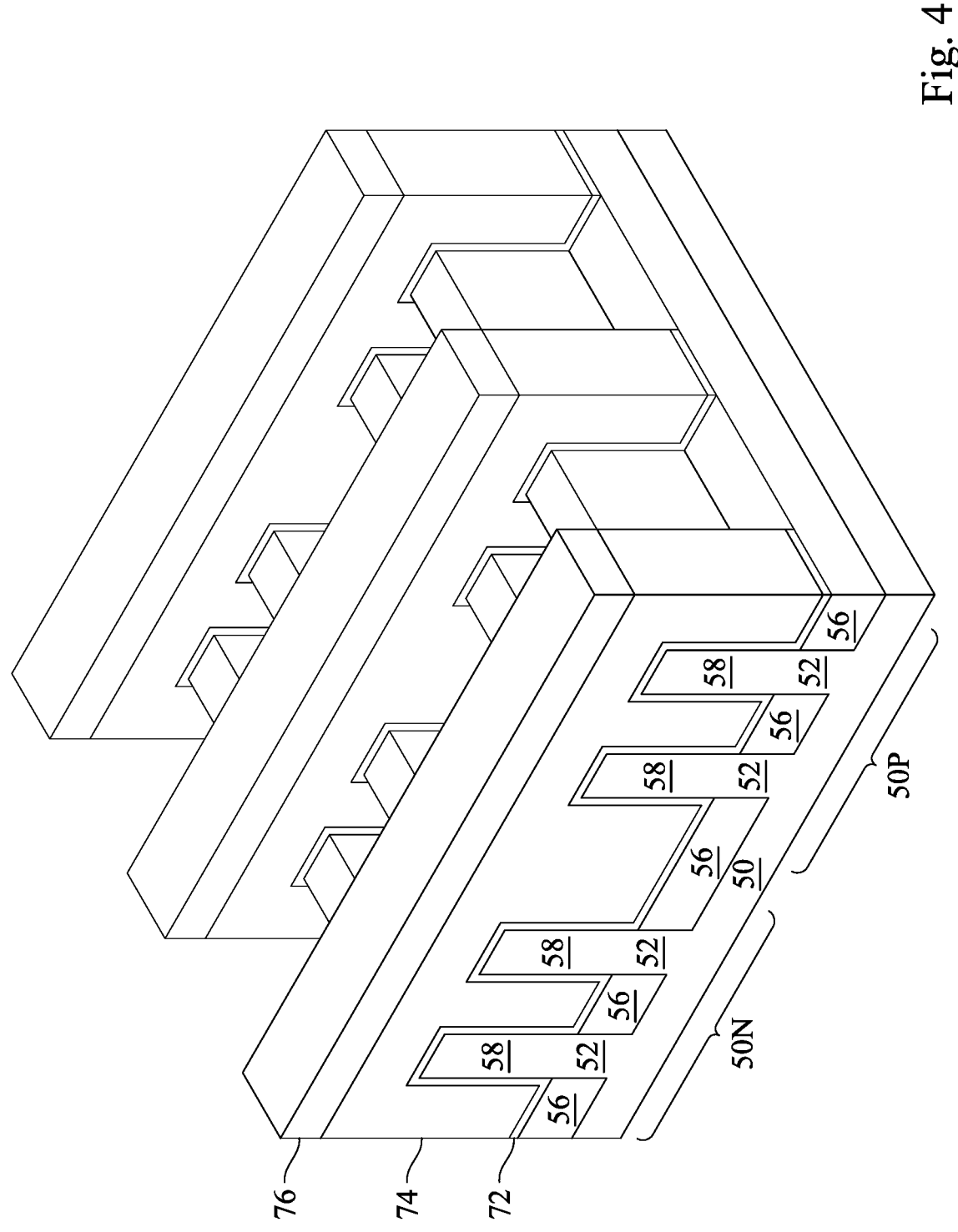

FIGS. 2-21B are views of intermediate stages in the manufacturing of FinFETs, in accordance with some embodiments. FIGS. 2, 3, and 4, are three-dimensional views showing a similar three-dimensional view as FIG. 1. FIGS. 5A, 6A, 7A, 8A, 9A, 10A, 11A, 12A, 13A, 14A, 15A, 16A, 17A, 18A, 19A, 20A, and 21A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19B, 20B, and 21B are cross-sectional views illustrated along a similar cross-section as reference cross-section B-B' in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 52. In some embodiments, the mask (or other layer) may remain on the fins 52.

STI regions 56 are formed over the substrate 50 and between adjacent fins 52. The STI regions 56 are disposed around lower portions of the fins 52 such that upper portions of the fins 52 protrude from between adjacent STI regions 56. In other words, the upper portions of the fins 52 extend above the top surfaces of the STI regions 56. The STI regions 56 separate the features of adjacent devices.

The STI regions 56 may be formed by any suitable method. For example, an insulation material can be formed over the substrate 50 and between adjacent fins 52. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. Although the STI regions 56 are each illustrated as a single layer, some embodiments may utilize multiple layers. For example, in some embodiments a liner (not separately illustrated) may first be formed along surfaces of the substrate 50 and the fins 52. Thereafter, a fill material, such as those previously described may be formed over the liner. In an embodiment, the insulation material is formed such that excess insulation material covers the fins 52. A removal process is then applied to the insulation material to remove excess insulation material over the fins 52. In some embodiments, a planarization process such as a chemical mechanical polish (CMP), an etch-back process, combinations thereof, or the like may be utilized. In embodiments in which a mask remains on the fins 52, the planarization process may expose the mask or remove the mask. After the planarization process, the top surfaces of the insulation material and the mask (if present) or the fins 52 are coplanar (within process variations). Accordingly, the top surfaces of the mask (if present) or the fins 52 are exposed through the insulation material. In the illustrated embodiment, no mask remains on the fins 52. The insulation material is then recessed to form the STI regions 56. The insulation material is recessed such that upper portions of the fins 52 protrude from between adjacent portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using any acceptable etching process, such as one that is selective to the material of the insulation material (e.g., selectively etches the insulation material of the STI regions 56 at a faster rate than the material of the fins 52). For example, an oxide removal may be performed using dilute hydrofluoric (dHF) acid.

The process previously described is just one example of how the fins 52 and the STI regions 56 may be formed. In some embodiments, the fins 52 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 52. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in n-type region 50N different from the material in p-type region 50P. In various embodiments, upper portions of the fins 52 may be formed of silicon-germanium ($Si_x$ $Ge_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ $cm^{-3}$ to $10^{14}$ $cm^{-3}$. After the implant, the photoresist is removed, such as by any acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ $cm^{-3}$ to $10^{14}$ $cm^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

In FIG. 3, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from the etching of insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

In FIG. 4, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

FIGS. 5A-21B illustrate various additional steps in the manufacturing of embodiment devices. FIGS. 5A-21B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 5B:
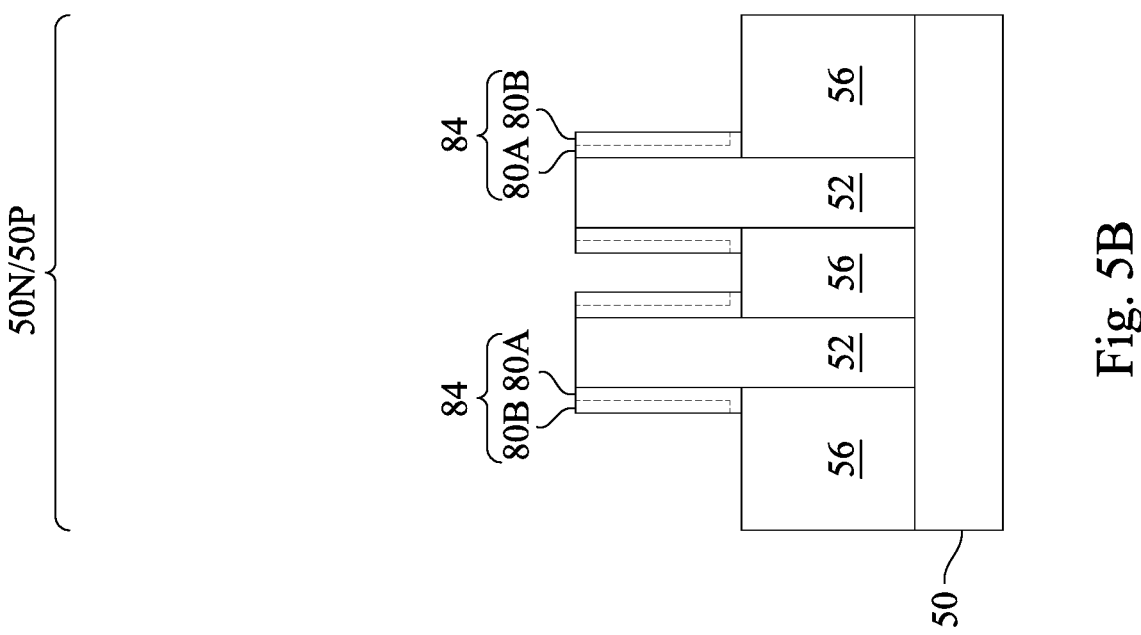
Figure 5A:
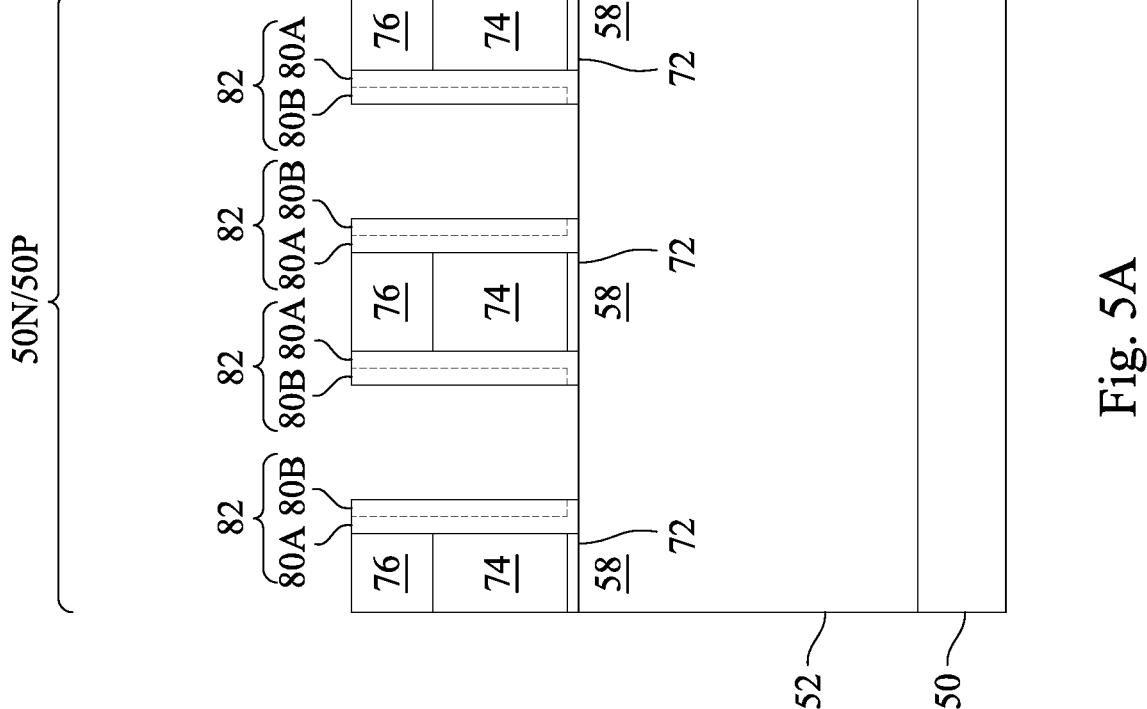

In FIGS. 5A-5B, gate spacers 82 are formed over the fins 52, on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like.

Other insulation materials formed by any acceptable process may be used. In the illustrated embodiment, the gate spacers 82 each include multiple layers, e.g., a first spacer layer 80A and a second spacer layer 80B. In some embodiments, the first spacer layers 80A and the second spacer layers 80B are formed of silicon oxycarbonitride (e.g., $SiO_xN_yC_{1-x-y}$, where x and y are in the range of 0 to 1), with the first spacer layers 80A formed of a similar or a different composition of silicon oxycarbonitride than the second spacer layers 80B. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82). In some embodiments the etch used to form the gate spacers 82 is adjusted so that the dielectric material(s), when etched, also have portions left on the sidewalls of fins 52 (thus forming fin spacers 84). After etching, the fin spacers 84 (if present) and the gate spacers 82 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of $10^{15}$ $cm^{-3}$ to $10^{19}$ $cm^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 6B:
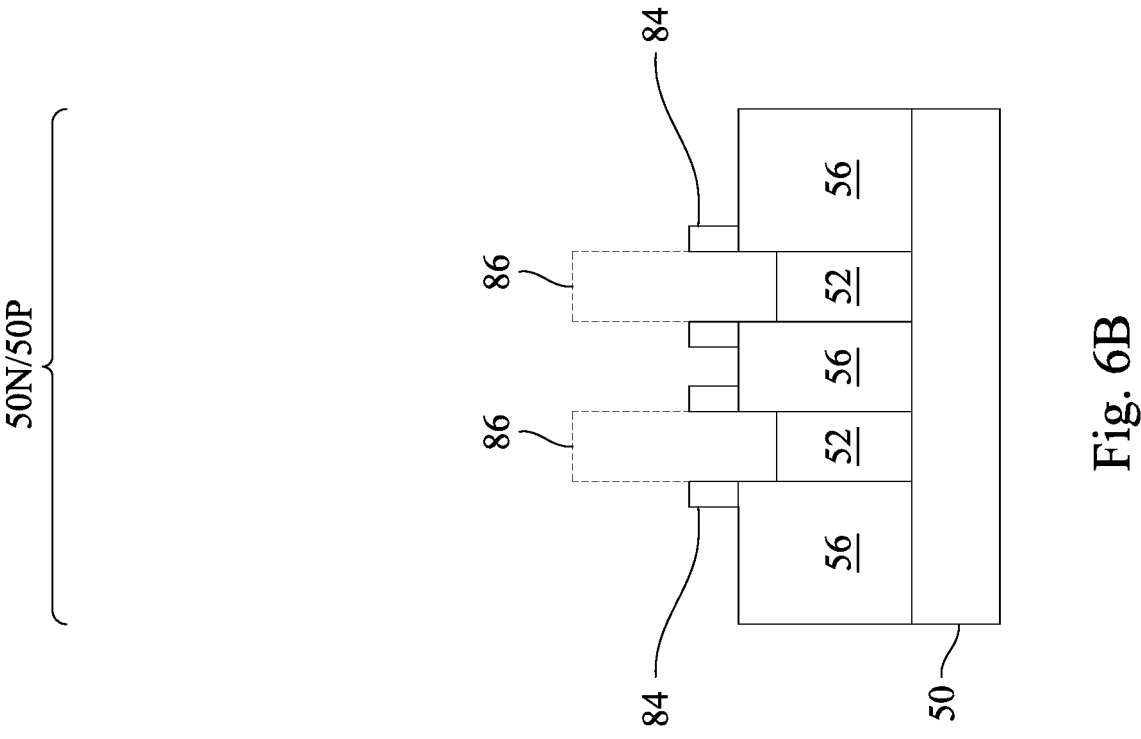
Figure 6A:
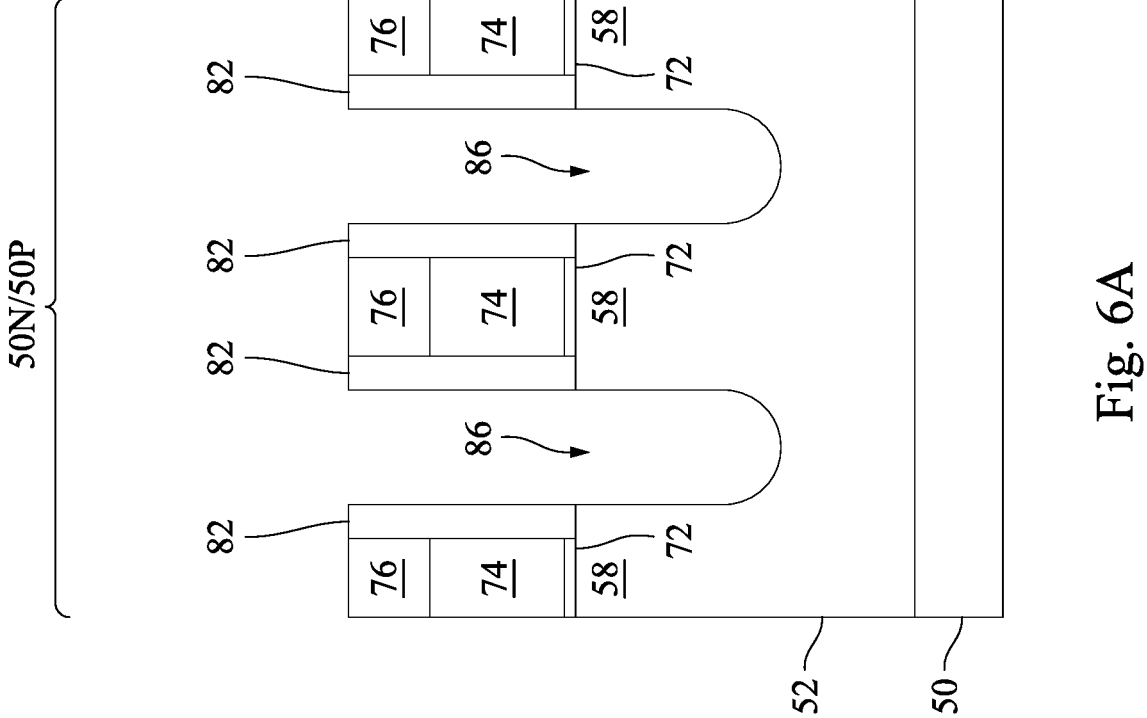

In FIGS. 6A-6B, source/drain recesses 86 are formed in the fins 52. In the illustrated embodiment, the source/drain recesses 86 extend into the fins 52. The source/drain recesses 86 may also extend into the substrate 50. In various embodiments, the source/drain recesses 86 may extend to a top surface of the substrate 50 without etching the substrate 50; the fins 52 may be etched such that bottom surfaces of the source/drain recesses 86 are disposed below the top surfaces of the STI regions 56; or the like. The source/drain recesses 86 may be formed by etching the fins 52 using an anisotropic etching processes, such as a RIE, a NBE, or the like. The gate spacers 82 and the dummy gates 74 collectively mask portions of the fins 52 during the etching processes used to form the source/drain recesses 86. Timed etch processes may be used to stop the etching of the source/drain recesses 86 after the source/drain recesses 86 reach a desired depth. The fin spacers 84 (if present) may be etched during or after the etching of the source/drain recesses 86, so that the height of the fin spacers 84 is reduced and the fin spacers 84 cover a portion of the sidewalls of the fins 52. The size and dimensions of the source/drain regions that will be subsequently formed in the source/drain recesses 86 may be controlled by adjusting the height of the fin spacers 84.

Figure 7B:
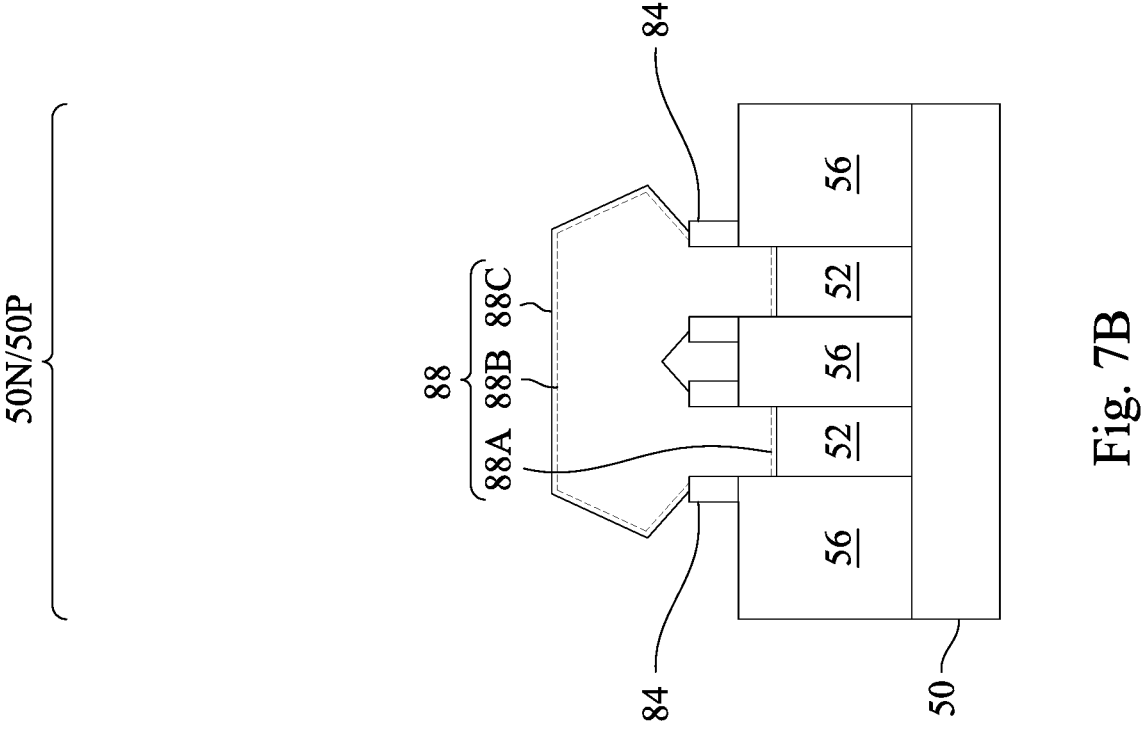
Figure 7A:
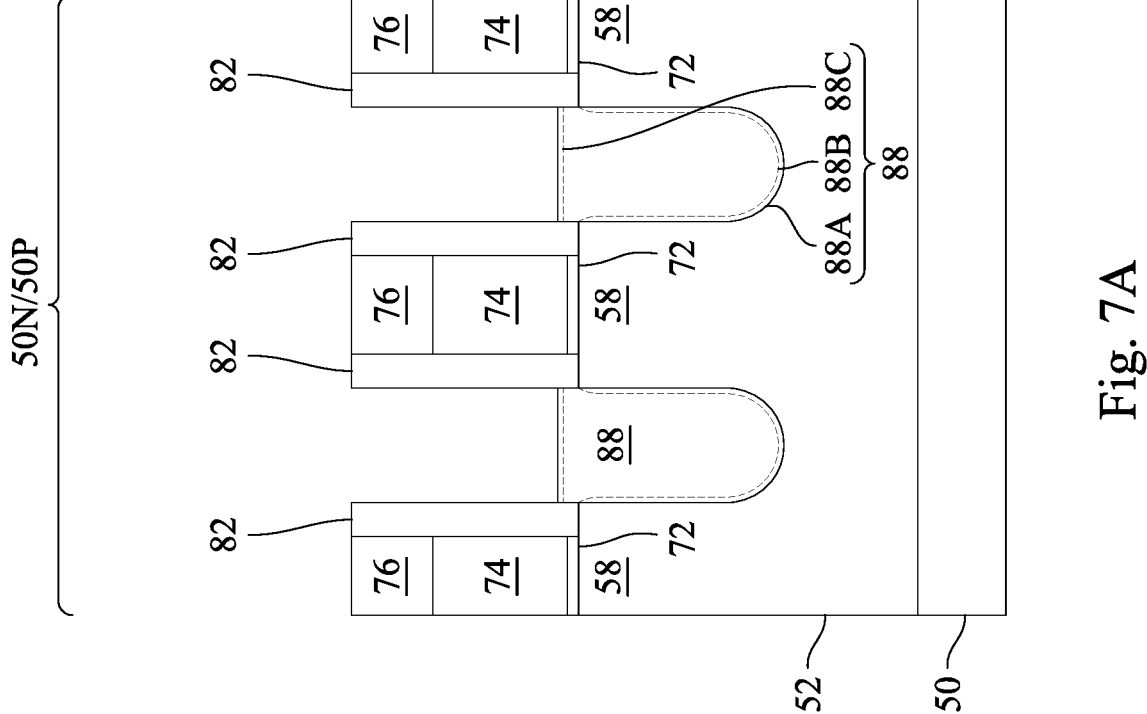

In FIGS. 7A-7B, epitaxial source/drain regions 88 are formed in the source/drain recesses 86. The epitaxial source/drain regions 88 are thus disposed in the fins 52 such that each dummy gate 74 (and corresponding channel region 58) is between respective adjacent pairs of the epitaxial source/drain regions 88. The epitaxial source/drain regions 88 thus adjoin the channel regions 58. In some embodiments, the gate spacers 82 are used to separate the epitaxial source/drain regions 88 from the dummy gates 74 by an appropriate lateral distance so that the epitaxial source/drain regions 88 do not short out with subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P. Then, the epitaxial source/drain regions 88 in the n-type region 50N are epitaxially grown in the source/drain recesses 86 in the n-type region 50N. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N. Then, the epitaxial source/drain regions 88 in the p-type region 50P are epitaxially grown in the source/drain recesses 86 in the p-type region 50P. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with impurities to form source/drain regions, similar to the process previously described for forming LDD regions, followed by an anneal. The source/drain regions may have an impurity concentration in the range of $10^{19}$ $cm^{-3}$ to $10^{21}$ $cm^{-3}$. The n-type and/or p-type impurities for source/drain regions may be any of the impurities previously described. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 7B. In some embodiments, adjacent epitaxial source/drain regions 88 remain separated after the epitaxy process is completed (not separately illustrated). In the illustrated embodiments, the fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

The epitaxial source/drain regions 88 may include one or more semiconductor material layers. For example, the epitaxial source/drain regions 88 may each include a liner layer 88A, a main layer 88B, and a finishing layer 88C (or more generally, a first semiconductor material layer, a second semiconductor material layer, and a third semiconductor material layer). Any number of semiconductor material layers may be used for the epitaxial source/drain regions 88. The liner layers 88A, the main layers 88B, and the finishing layers 88C may be formed of different semiconductor materials and may be doped to different impurity concentrations. In some embodiments, the main layers 88B have a greater concentration of impurities than the finishing layers 88C, and the finishing layers 88C have a greater concentration of impurities than the liner layers 88A. In embodiments in which the epitaxial source/drain regions 88 include three semiconductor material layers, the liner layers 88A may be grown in the source/drain recesses 86, the main layers 88B may be grown on the liner layers 88A, and the finishing layers 88C may be grown on the main layers 88B. Forming the liner layers 88A with a lesser concentration of impurities than the main layers 88B may increase adhesion in the source/drain recesses 86, and forming the finishing layers 88C with a lesser concentration of impurities than the main layers 88B may reduce out-diffusion of dopants from the main layers 88B during subsequent processing.

Figure 8B:
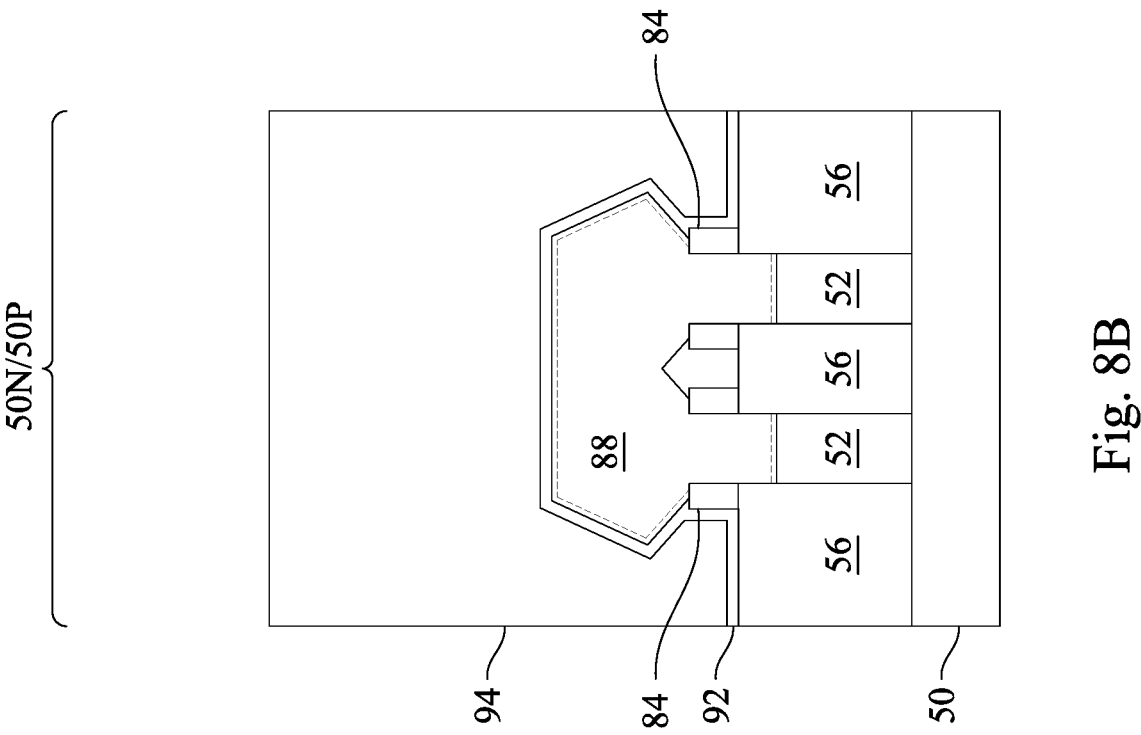
Figure 8A:
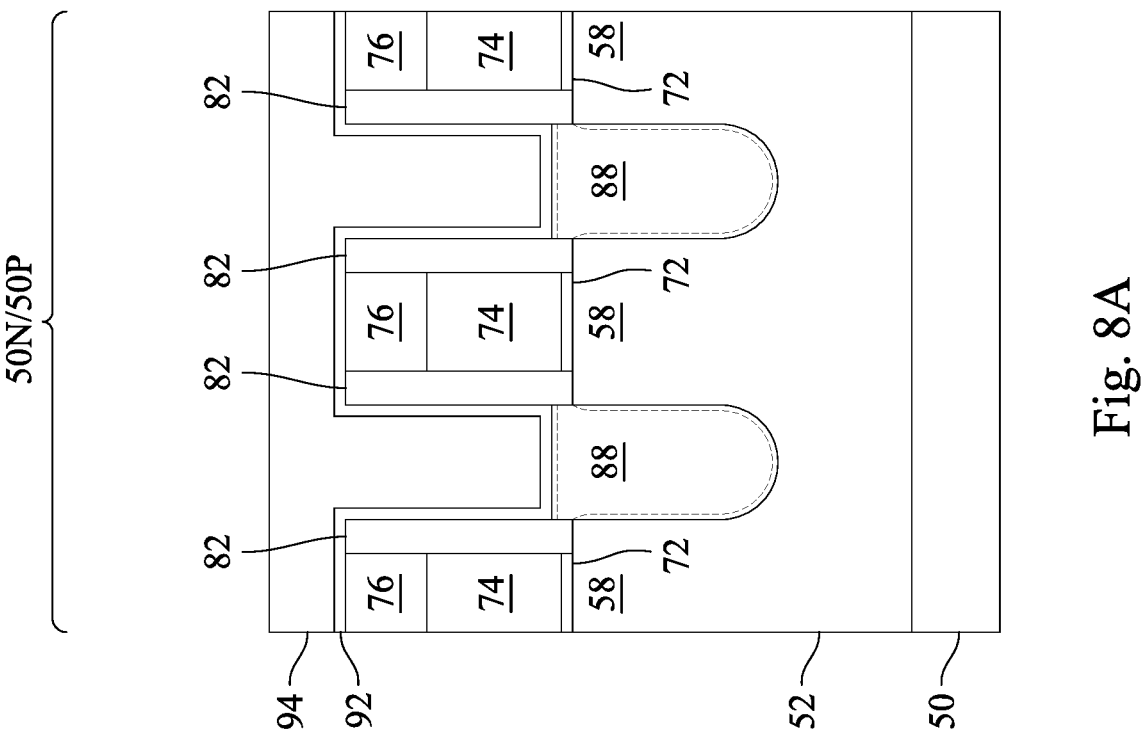

In FIGS. 8A-8B, a first inter-layer dielectric (ILD) 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material, such as silicon nitride, silicon oxide, silicon oxynitride, or the like, having a high etching selectivity from the etching of the first ILD 94. The CESL 92 may be formed by an any suitable method, such as CVD, ALD, or the like.

Figures 9A, 9B:
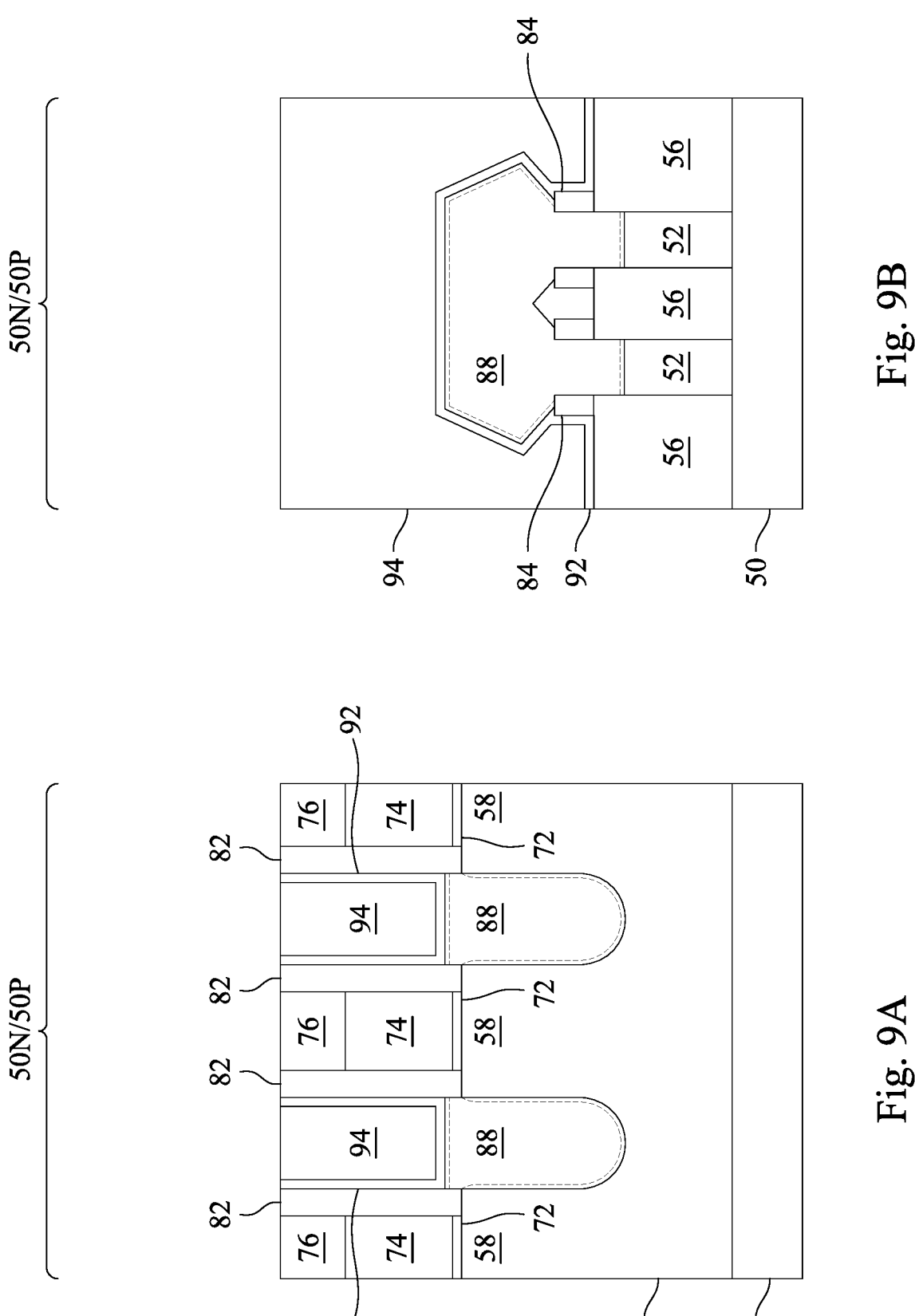

In FIGS. 9A-9B, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates

74, and portions of the gate spacers 82 along sidewalls of the masks 76. After the planarization process, the top surfaces of the first ILD 94, the CESL 92, the gate spacers 82, and the masks 76 (if present) or the dummy gates 74 are coplanar (within process variations). Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

Figures 10A, 10B:
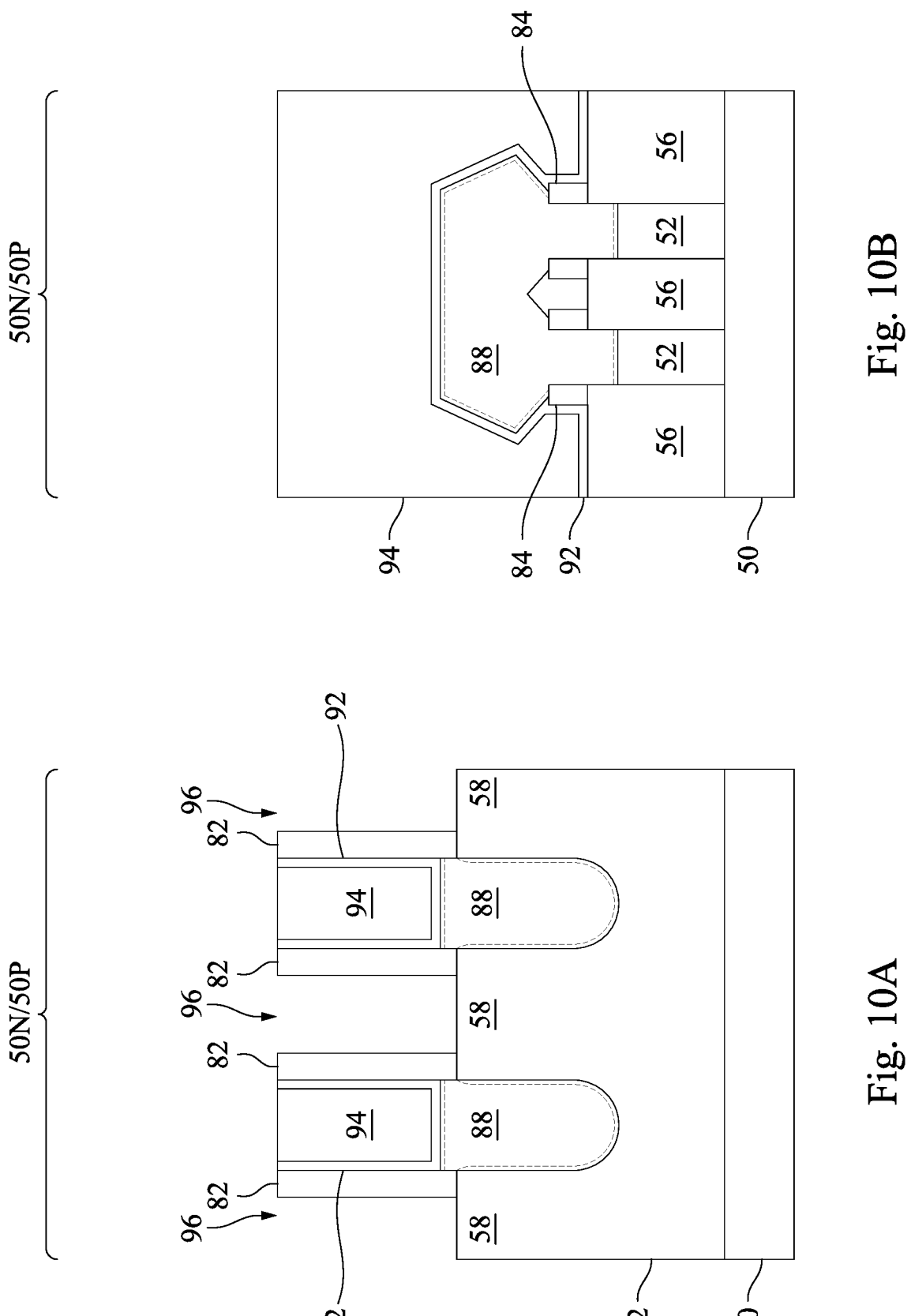

In FIGS. 10A-10B, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figures 11A, 11B:
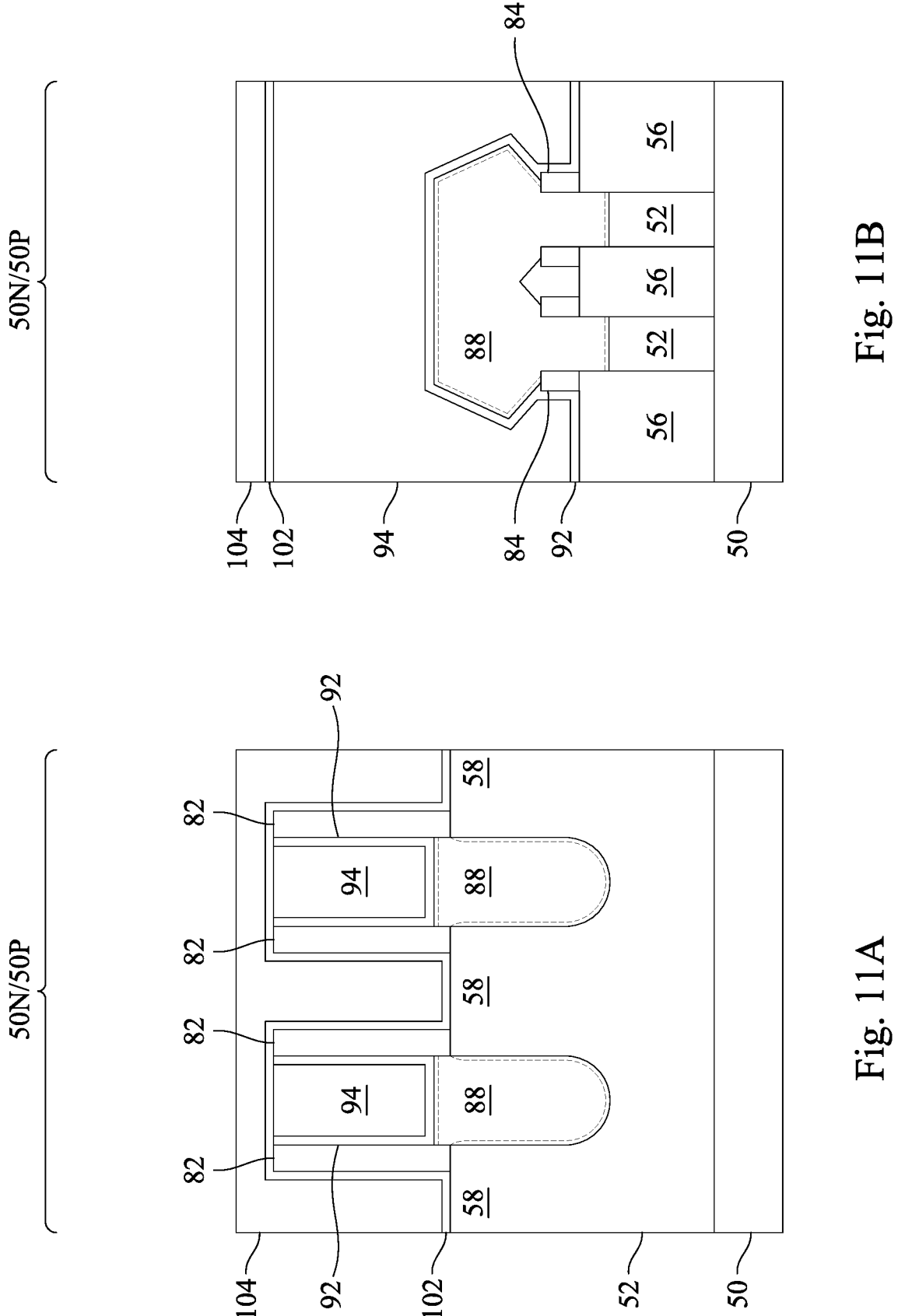

In FIGS. 11A-11B, a gate dielectric layer 102 is formed in the recesses 96. A gate electrode layer 104 is formed on the gate dielectric layer 102. The gate dielectric layer 102 and the gate electrode layer 104 are layers for replacement gates, and each extend along sidewalls and over top surfaces of the channel regions 58.

The gate dielectric layer 102 is disposed on the sidewalls and/or the top surfaces of the fins 52 and on the sidewalls of the gate spacers 82. The gate dielectric layer 102 may also be formed on the top surfaces of the first ILD 94 and the gate spacers 82. The gate dielectric layer 102 may include an oxide such as silicon oxide or a metal oxide, a silicate such as a metal silicate, combinations thereof, multi-layers thereof, or the like. The gate dielectric layer 102 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. The formation methods of the gate dielectric layer 102 may include molecular-beam deposition (MBD), ALD, PECVD, and the like. In embodiments where portions of the dummy dielectrics 72 remain in the recesses 96, the gate dielectric layer 102 includes a material of the dummy dielectrics 72 (e.g., silicon oxide). Although a single-layered gate dielectric layer 102 is illustrated, the gate dielectric layer 102 may include any number of interfacial layers and any number of main layers. For example, the gate dielectric layer 102 may include an interfacial layer and an overlying high-k dielectric layer.

The gate electrode layer 104 may include a metal-containing material such as titanium nitride, titanium oxide, tantalum nitride, tantalum carbide, tungsten, cobalt, ruthenium, aluminum, combinations thereof, multi-layers thereof, or the like. Although a single-layered gate electrode layer 104 is illustrated, the gate electrode layer 104 may include any number of work function tuning layers, any number of barrier layers, any number of glue layers, and a fill material.

The formation of the gate dielectric layer 102 in the n-type region 50N and the p-type region 50P may occur simultaneously such that the gate dielectric layer 102 in each region is formed of the same material(s), and the formation of the gate electrode layer 104 may occur simultaneously such that the gate electrode layer 104 in each region is formed of the same material(s). In some embodiments, the gate dielectric layers 102 in each region may be formed by distinct processes, such that the gate dielectric layers 102 may be different materials and/or have a different number of layers, and/or the gate electrode layers 104 in each region may be formed by distinct processes, such that the gate electrode layers 104 may be different materials and/or have a different number of layers. Various masking steps may be used to mask and expose appropriate regions when using distinct processes.

Figures 12A, 12B:
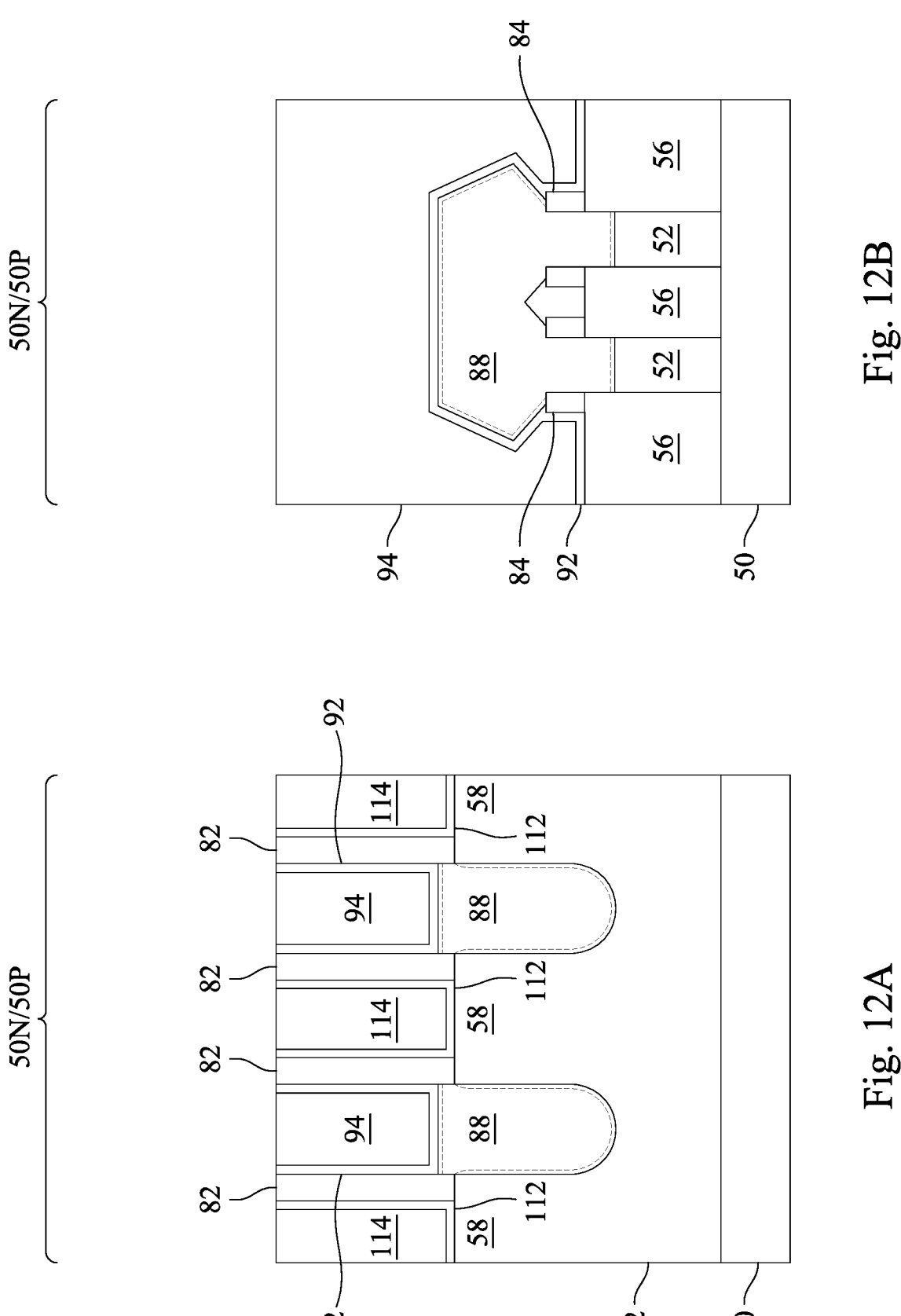

In FIGS. 12A-12B, a removal process is performed to remove the excess portions of the materials of the gate dielectric layer 102 and the gate electrode layer 104, which excess portions are over the top surfaces of the first ILD 94, the CESL 92, and the gate spacers 82, thereby forming gate dielectrics 112 and gate electrodes 114. In some embodiments, a planarization process such as a chemical mechanical polish (CMP), an etch-back process, combinations thereof, or the like may be utilized. The gate dielectric layer 102, when planarized, has portions left in the recesses 96 (thus forming the gate dielectrics 112). The gate electrode layer 104, when planarized, has portions left in the recesses 96 (thus forming the gate electrodes 114). The top surfaces of the gate spacers 82, the CESL 92, the first ILD 94, the gate dielectrics 112, and the gate electrodes 114 are coplanar (within process variations). The gate dielectrics 112 and the gate electrodes 114 form replacement gates of the resulting FinFETs. Each respective pair of a gate dielectric 112 and a gate electrode 114 may be collectively referred to as a "gate structure." The gate structures each extend along top surfaces, sidewalls, and bottom surfaces of a channel region 58 of fins 52.

Figures 13A, 13B:
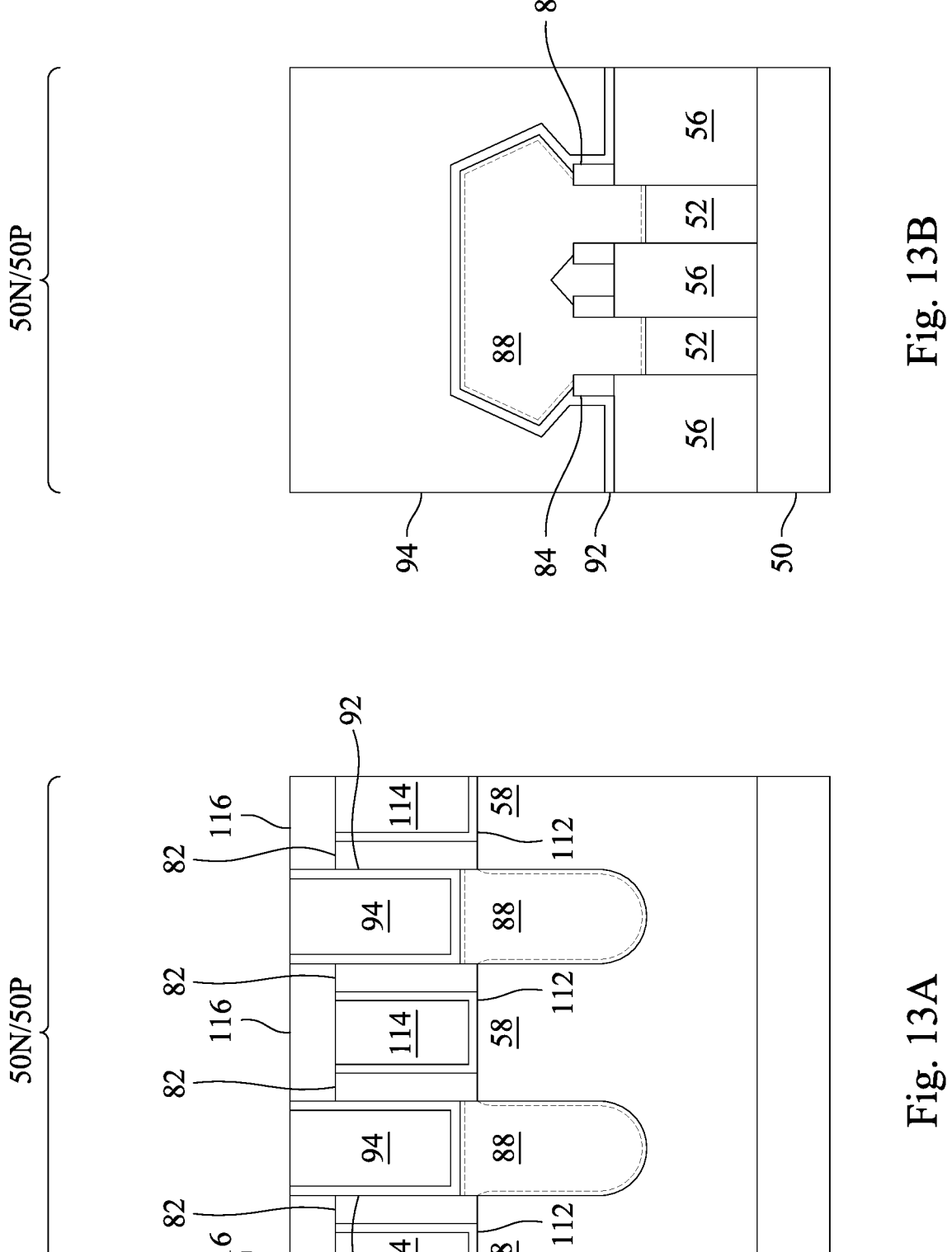

In FIGS. 13A-13B, gate masks 116 are formed over the gate structures (including the gate dielectrics 112 and the gate electrodes 114) and optionally the gate spacers 82. The gate masks 116 are formed of one or more dielectric material(s) that have a high etching selectivity from the etching of the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used.

As an example to form the gate masks 116, the gate structures (including the gate dielectrics 112 and the gate electrodes 114) and optionally the gate spacers 82 may be recessed using any acceptable etching process. In the illustrated embodiment, the gate spacers 82 and the gate structures are recessed to the same depth. In another embodiment, the gate structures are recessed to a greater depth than the gate spacers 82. In yet another embodiment, the gate structures are recessed but the gate spacers 82 are not recessed. The dielectric material(s) are then conformally deposited in the recesses, and may also be formed on the top surfaces of the first ILD 94. A removal process is performed to remove the excess portions of the dielectric material(s), which excess portions are over the top surfaces of the first ILD 94, thereby forming the gate masks 116. In some embodiments, a planarization process such as a chemical mechanical polish (CMP), an etch-back process, combinations thereof, or the like may be utilized. The dielectric material(s), when planarized, have portions left in the recesses (thus forming the gate masks 116). Gate contacts will be subsequently formed to penetrate through the gate masks 116 to contact the top surfaces of the gate electrodes 114.

Figures 14A, 14B:
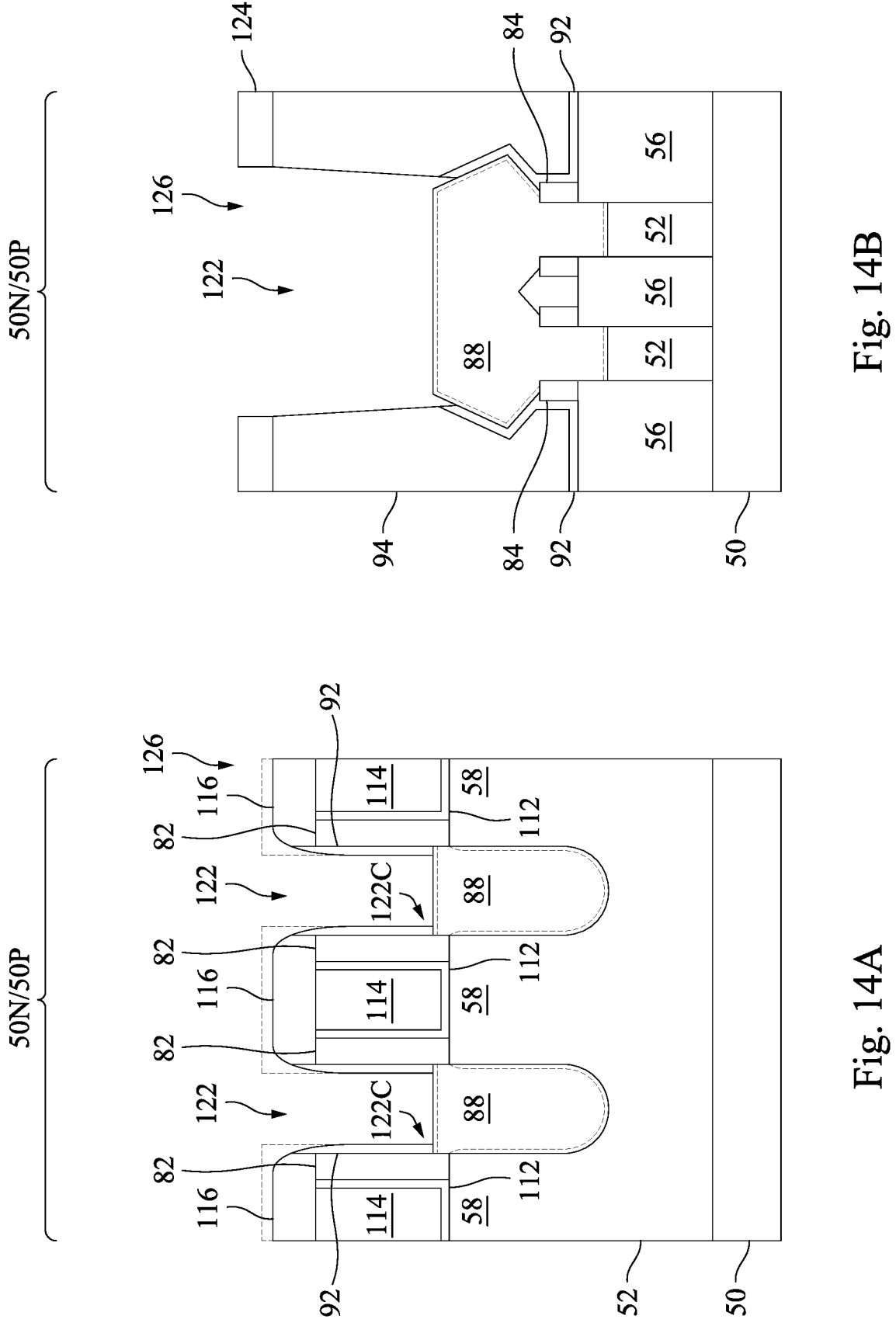

In FIGS. 14A-14B, contact openings 122 are formed through the first ILD 94 and the CESL 92. The contact openings 122 are source/drain contact openings formed by a self-aligned contact (SAC) process so that substantially no residue of the first ILD 94 remains in corner regions 122C of the contact openings 122. The corner regions 122C of the contact openings 122 are the corners defined by the sidewalls of the CESL 92 and the top surfaces of the epitaxial source/drain regions 88 in the cross-section of FIG. 14A.

As an example to form the contact openings 122, a contact mask 124 may be formed over the first ILD 94 and the gate masks 116. The contact mask 124 is patterned with slot openings 126 having a pattern of the contact openings 122. The contact mask 124 may be, e.g., a photoresist, such as a single layer photoresist, a bi-layer photoresist, a tri-layer photoresist, or the like, which may be patterned using acceptable photolithography techniques to form the slot openings 126. Other types of masks formed by any acceptable process may be used. The slot openings 126 are strips that run parallel to the lengthwise directions of the fins 52, overlapping the first ILD 94 and the gate masks 116. The first ILD 94 may then be etched using the contact mask 124 as an etching mask and using the CESL 92 as an etch stop layer. The etching may be any acceptable etching process, such as one that is selective to the material of the first ILD 94 (e.g., selectively etches the material of the first ILD 94 at a faster rate than the material(s) of the CESL 92 and the gate masks 116). The etching process may be anisotropic. The portions of the first ILD 94 uncovered by the contact mask 124 (e.g., exposed by the slot openings 126) are thus etched to form the contact openings 122. The contact openings 122 are then extended through the CESL 92 by any acceptable etching process to expose the epitaxial source/drain regions 88. After the etching processes, the contact mask 124 is removed, such as by any acceptable ashing process.

Depending on the selectivity of the etching processes used to form the contact openings 122, some losses of the CESL 92 and/or the gate masks 116 may occur. Referring to the cross-section of FIG. 14A, the contact openings 122 may have funnel shapes, where the upper portions of the contact openings 122 have curved sidewalls (e.g., tapered sidewalls), and the lower portions of the contact openings 122 have substantially straight sidewalls (e.g., non-tapered sidewalls). The dimensions of the CESL 92 and/or the gate masks 116 may be reduced. Specifically, upper portions of the gate masks 116 and the CESL 92 can have reduced widths such that the upper portions of the gate masks 116 and the CESL 92 have curved sidewalls, and the lower portions of the gate masks 116 and the CESL 92 have substantially straight sidewalls. Further, the gate masks 116 and the CESL 92 can have reduced heights, and in fact, the top surfaces of the CESL 92 may be recessed below the top surfaces of the gate masks 116, thereby exposing the curved sidewalls of the gate masks 116.

Figures 15A, 15B:
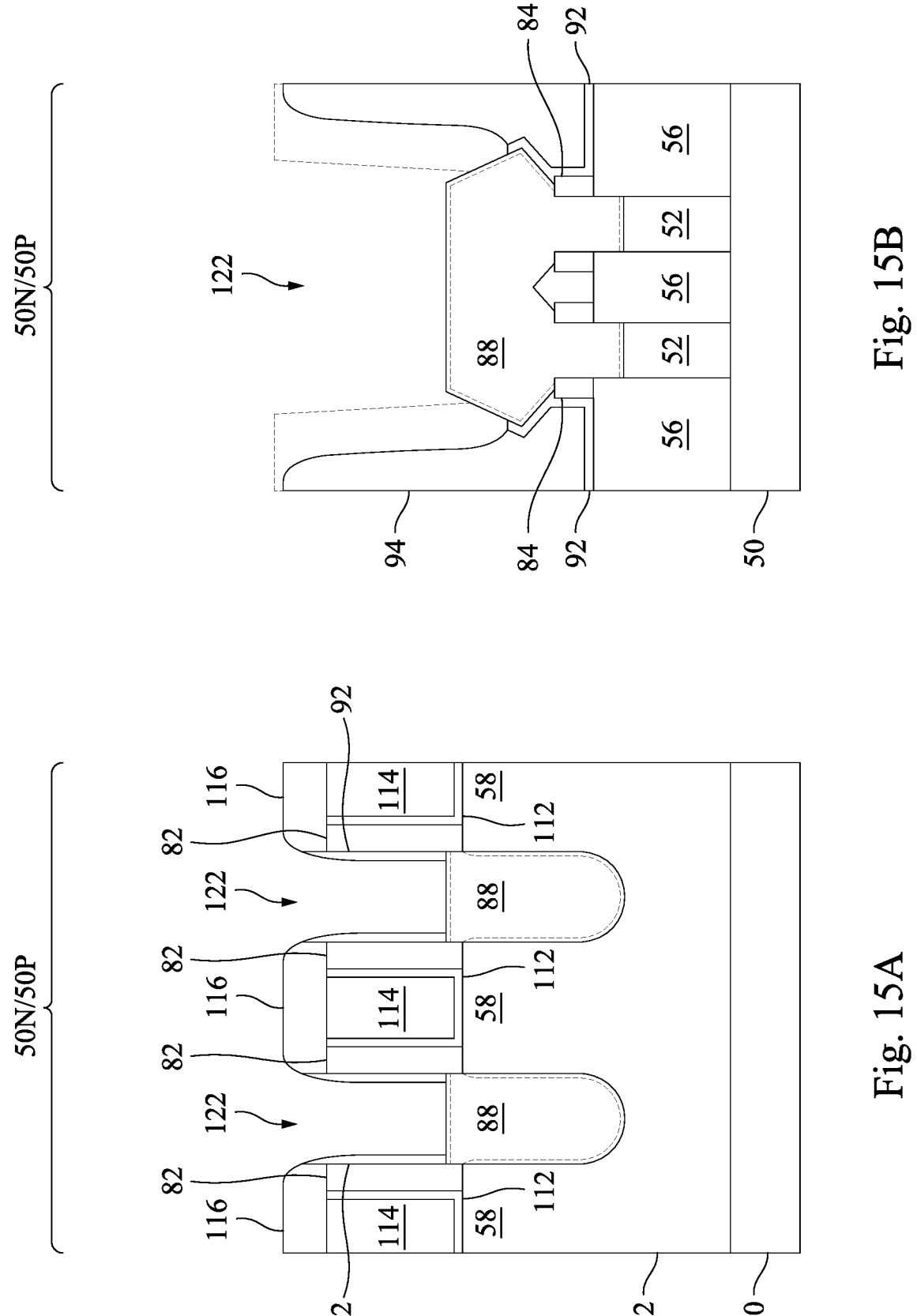

In FIGS. 15A-15B, the contact openings 122 are expanded to enlarge the landing window of source/drain contacts that will be subsequently formed in the contact openings 122. For example, before expansion the contact openings 122 can have an initial width in the range of 10 nm to 100 nm, and after expansion the contact openings 122 can have a final width in the range of 11 nm to 105 nm, with the final width being from 1% to 5% greater than the initial width. The contact openings 122 may be expanded using any acceptable etching process, such as one that is selective to the material of the first ILD 94 (e.g., selectively etches the material of the first ILD 94 at a faster rate than the materials of the gate masks 116). The etching process may be isotropic, such that the height of the first ILD 94 is decreased and corners of the first ILD 94 are rounded by the etching. For example, before etching the first ILD 94 can have an initial height in the range of 40 nm to 80 nm, and after etching the first ILD 94 can have a final height in the range of 20 nm to 60 nm, with the final height being from 25% to 50% less than the initial height. The contact openings 122 may also be expanded through the CESL 92.

In some embodiments, the etching process is a dry etch performed without plasma. For example, when the first ILD 94 is formed of silicon oxide, the dry etch can be performed with an etching gas solution that includes hydrogen fluoride (HF) and optionally ammonia ($NH_3$). The etching gas solution can be flowed over the first ILD 94 and in the contact openings 122, while no plasma is generated. Inclusion of ammonia ($NH_3$) in the etching gas solution is optional, and its inclusion lowers the activation energy of the reaction between the etching gas solution and the material of the first ILD 94, allowing the etching to be performed at a low temperature. In some embodiments, the dry etch is performed at a low temperature that is not lower than room temperature. For example, when the etching gas solution does not include ammonia ($NH_3$), the dry etch can be performed at a temperature in the range of 20° C. to 40° C., and when the etching gas solution includes ammonia ($NH_3$), the dry etch can be performed at room temperature, such as a temperature in the range of 20° C. to 40° C. The reaction between the etching gas solution and the material of the first ILD 94 is exothermic, and so performing it at a low temperature can increase the efficiency of the reaction. In embodiments where the etching gas solution includes hydrogen fluoride (HF) and ammonia ($NH_3$), the reaction between the etching gas solution and the material of the first ILD 94 includes two diffusions (e.g., gas phase diffusion and surface diffusion) and two adsorptions (e.g., physisorption and chemisorption), and so the reaction may have an incubation period that increases the duration of the dry etch. For example, the dry etch can be performed for a duration in the range of 3 second to 20 seconds. The dry etch converts the material of the first ILD 94 to one or more byproduct(s). The byproducts can include gas phase byproduct(s) (e.g., silicon tetrafluoride) and/or solid phase byproduct(s) (e.g., ammonium fluorosilicate). After the dry etch, a thermal treatment can be performed at a sufficiently high temperature and duration to sublimate the solid phase byproduct(s) and produce additional gas phase byproduct(s). For example, a thermal treatment can be performed at a temperature in the range of 100° C. to 180° C., and for a duration in the range of 60 seconds to 240 seconds. The thermal treatment may be performed at a higher temperature than the dry etch, particularly in embodiments where etching gas solution includes ammonia ($NH_3$). Once the solid phase byproduct(s) are sublimated to gas phase byproduct(s), they can be evacuated from the contact openings 122 by, e.g., a vacuum. In some embodiments, the etching process includes multiple cycles of the dry etch and the thermal treatment. The cycles can be performed until the contact openings 122 are expanded by a desired amount. For example, from 1 to 10 cycles of the dry etch and thermal treatment can be performed.

As noted above, the final width of the contact openings 122 is greater than the initial width of the contact openings 122. The isotropic etching process for expanding the contact openings 122 (described for FIGS. 15A-15B) can be more finally controlled than the anisotropic etching process for initially forming the contact openings 122 (described for FIGS. 14A-14B). Initially forming the contact openings 122 to a smaller width and then expanding them to a larger width with a highly controllable etching process can avoid shorting of adjacent epitaxial source/drain regions 88, as compared to initially forming the contact openings 122 to a larger width. Further, the isotropic etching process for expanding the contact openings 122 is selective to the first ILD 94, so that the gate masks 116 are substantially unetched by the etching process. As such, the width of the contact openings 122 in the cross-section of FIG. 14B is increased, but the width of the contact openings 122 in the cross-section of FIG. 14A remains substantially unchanged. Shorting of the subsequently formed contacts to, e.g., the gate electrodes 114 may thus be avoided.

Figures 16A, 16B:
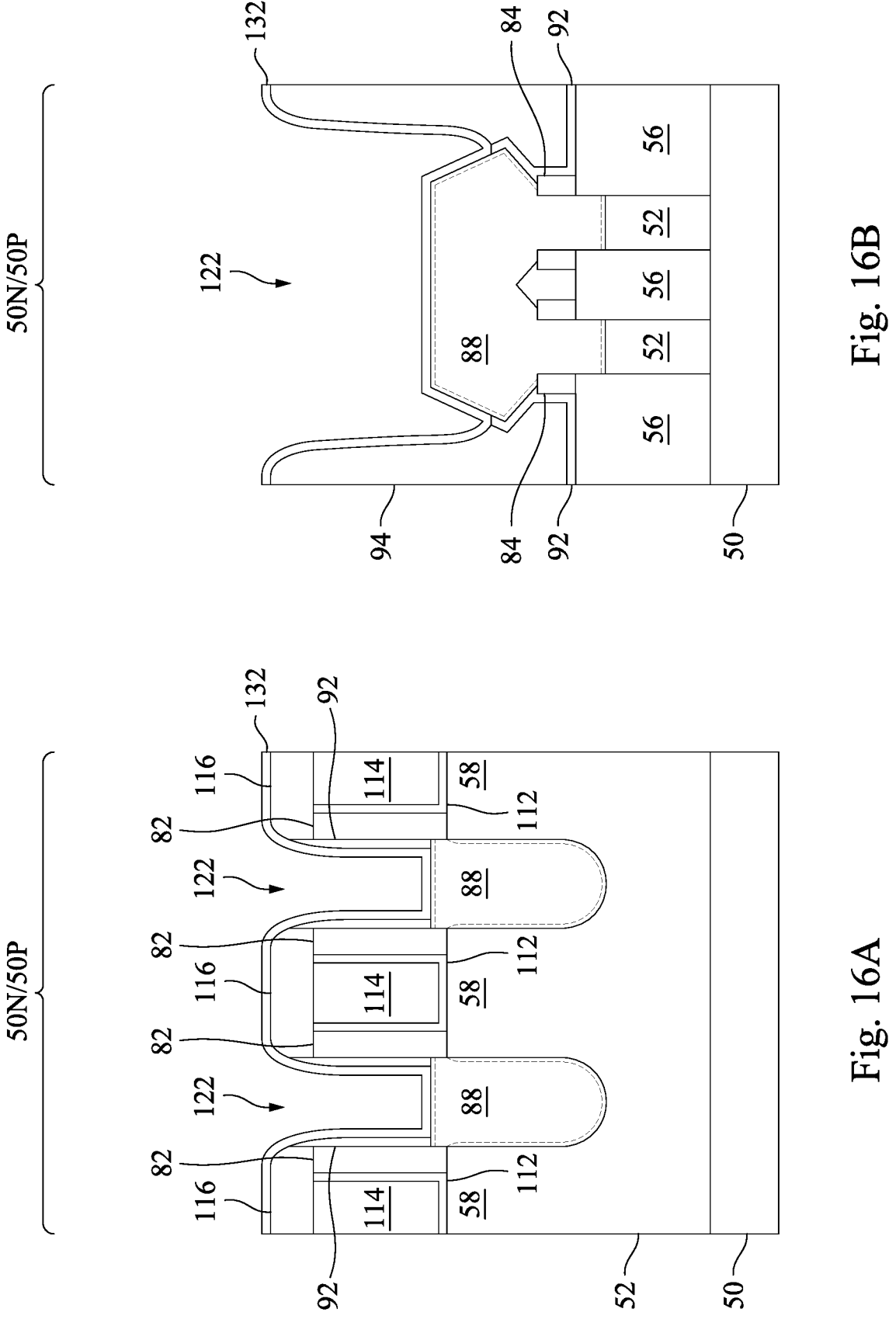

In FIGS. 16A-16B, a protective layer 132 is conformally deposited in the contact openings 122 and on the gate masks 116. The protective layer 132 is disposed on the sidewalls and/or the top surfaces of the epitaxial source/drain regions 88, the CESL 92, the first ILD 94, and the gate masks 116. Notably, the protective layer 132 is formed in contact with the curved sidewalls of the gate masks 116 and the CESL 92 that are exposed by the etching process for initially forming the contact openings 122 (described for FIGS. 14A-14B). The protective layer 132 is formed of one or more dielectric material(s) that have a high etching selectivity from the etching of the epitaxial source/drain regions 88. Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In some embodiments, the protective layer 132 is formed of silicon nitride by ALD. The protective layer 132 can be formed to a thickness in the range of 1 nm to 3 nm. Such a thickness provides sufficient protection to the underlying features in subsequent processing.

Notably, the protective layer 132 is deposited in the contact openings 122 after the contact openings 122 are expanded. As noted above, expanding the contact openings 122 allows the landing window for subsequently formed source/drain contacts to be enlarged. Expanding the contact openings 122 before forming the protective layer 132 ensures the expansion process will not be blocked by the protective layer 132. Additionally, and as will be subsequently described, forming the protective layer 132 helps avoid further expansion of the contact openings 122 during subsequent processing.

Figures 17A, 17B:
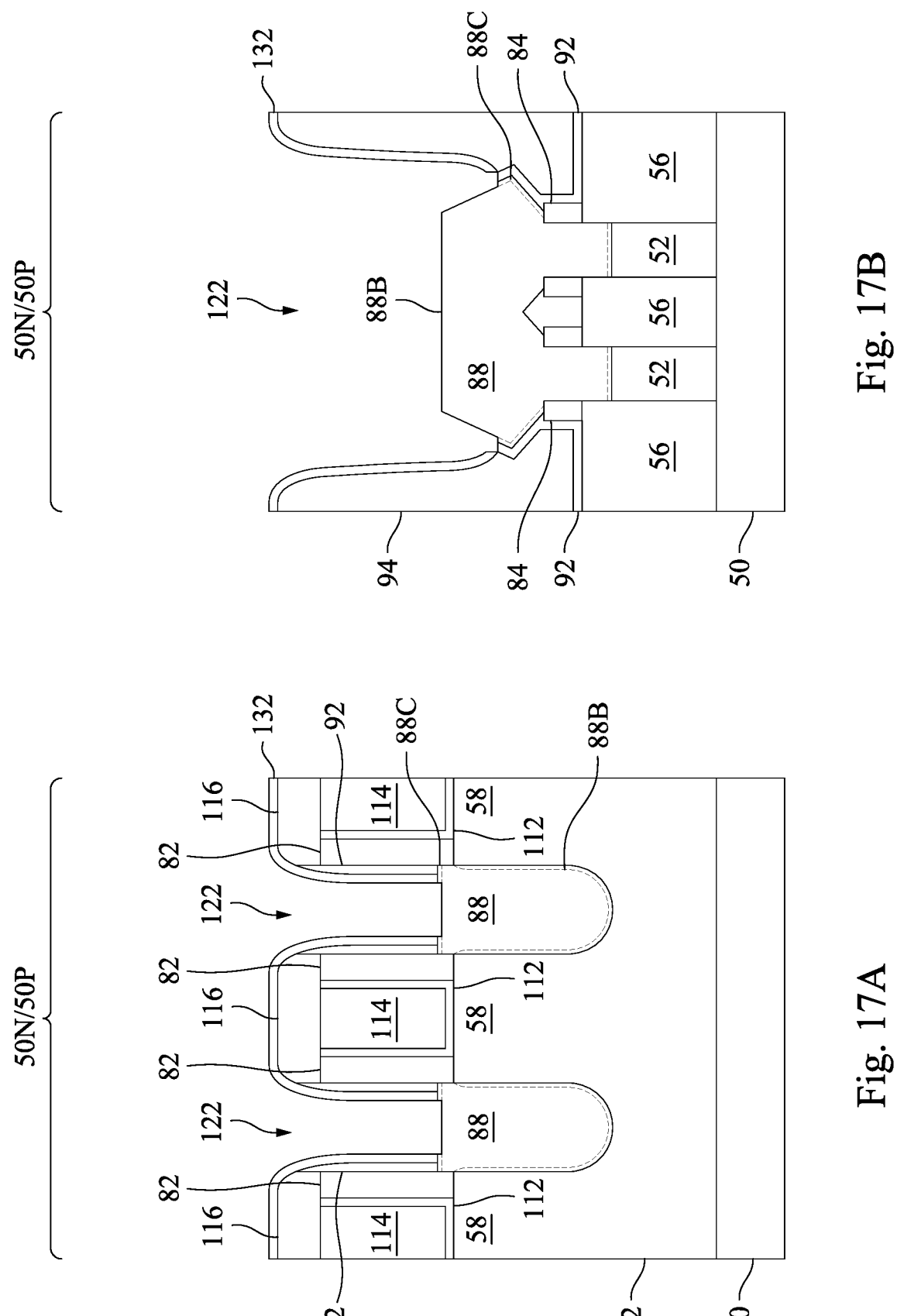

In FIGS. 17A-17B, the contact openings 122 are extended through the protective layer 132 to expose the epitaxial source/drain regions 88. The contact openings 122 may be extended using any acceptable etching process, such as one that is selective to the material of the protective layer 132 (e.g., selectively etches the material of the protective layer 132 at a faster rate than the material(s) of the epitaxial source/drain regions 88). The etching process may be anisotropic.

In some embodiments, the contact openings 122 are extended through the protective layer 132 by a dry etch using carbonyl sulfide (COS). COS provides a high etching selectivity between the insulation material of the protective layer 132 (e.g., silicon nitride) and semiconductor materials with a high impurity concentration. As noted above, the epitaxial source/drain regions 88 may include main layers 88B and finishing layers 88C, with the main layers 88B having a greater concentration of impurities than the finishing layers 88C. Performing a dry etch with COS allows the contact openings 122 to be extended through the protective layer 132 and the finishing layers 88C, so that the contact openings 122 expose the main layers 88B with substantially no etching of the main layers 88B. The source/drain contacts that will be subsequently formed in the contact openings 122 may thus contact the main layers 88B (e.g., highly doped regions) of the epitaxial source/drain regions 88. Forming source/drain contacts to highly doped regions of the epitaxial source/drain regions 88 decreases the contact resistance of the devices. Further, avoiding etching of the main layers 88B increases the amount of majority carriers available in the epitaxial source/drain regions 88. Device performance may thus be improved.

In some embodiments, the contact openings 122 are extended through the protective layer 132 by a self-aligned process that is similar to the self-aligned process described for the initial formation of the contact openings 122. For example, a mask having a pattern of slot openings can be formed over the protective layer 132 and used as an etching mask to extend the contact openings 122 through the protective layer 132. As such, the epitaxial source/drain regions 88 are exposed through the protective layer 132, but a majority of the gate masks 116, the first ILD 94, and the CESL 92 remain covered by the protective layer 132.

Figures 18A, 18B:
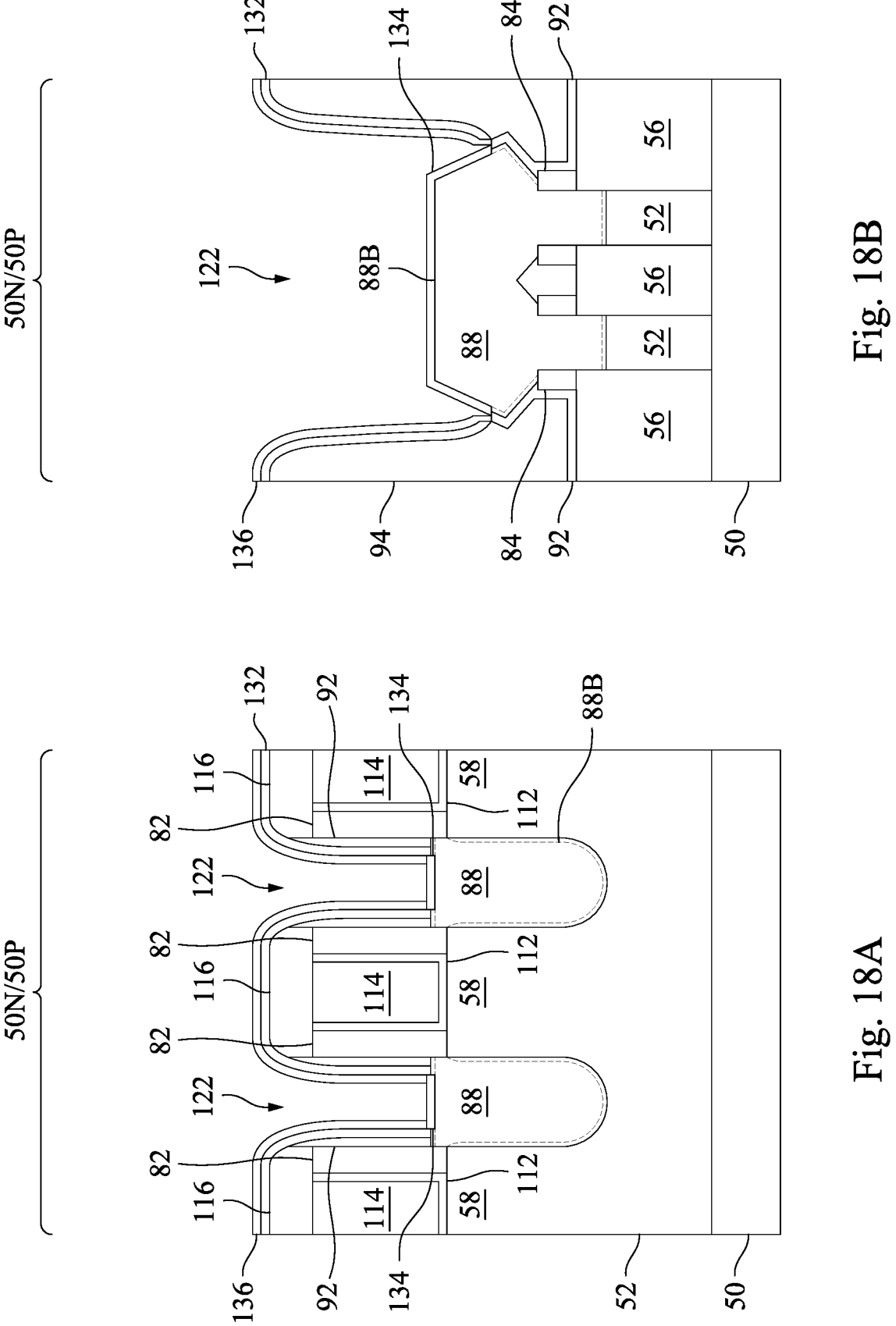

In FIGS. 18A-18B, metal-semiconductor alloy regions 134 are formed in the contact openings 122 and on the portions of the epitaxial source/drain regions 88 exposed by the contact openings 122. For example, when the main layers 88B of the epitaxial source/drain regions 88 are exposed, the metal-semiconductor alloy regions 134 are formed so that they are on the main layers 88B and extend through the finishing layers 88C (see FIGS. 17A-17B). The metal-semiconductor alloy regions 134 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 134 can be formed by depositing a metal 136 on the protective layer 132 and in the contact openings 122 (e.g., on the epitaxial source/drain regions 88), and then performing a thermal anneal process. The metal 136 can be any metal capable of reacting with the semiconductor materials (e.g., silicon, silicon-germanium, germanium, etc.) of the epitaxial source/drain regions 88 to form a low-resistance metal-semiconductor alloy, such as nickel, cobalt, titanium, tantalum, platinum, tungsten, other noble metals, other refractory metals, rare earth metals or their alloys. The metal 136 can be deposited by a deposition process such as ALD, CVD, PVD, or the like. After the thermal anneal process, a cleaning process is performed to remove any residue of the metal 136, such as from surfaces of the metal-semiconductor alloy regions 134 and the protective layer 132. The cleaning process may be a wet etch performed with dilute hydrofluoric (dHF) acid.

As noted above, the protective layer 132 is patterned so that a majority of the gate masks 116, the first ILD 94, and the CESL 92 remain covered by the protective layer 132.

Thus, etching of the gate masks 116, the first ILD 94, and the CESL 92 may be avoided during the cleaning process for removing the residue of the metal 136, such that no etching of the gate masks 116, the first ILD 94, or the CESL 92 occurs. Protecting the gate masks 116, the first ILD 94, and the CESL 92 with the protective layer 132 can avoid undesired expansion of the contact openings 122 during removal of residue of the metal 136 from the contact openings 122. Shorting of the subsequently formed contacts to, e.g., the gate electrodes 114 may thus be avoided.

Figures 19A, 19B:
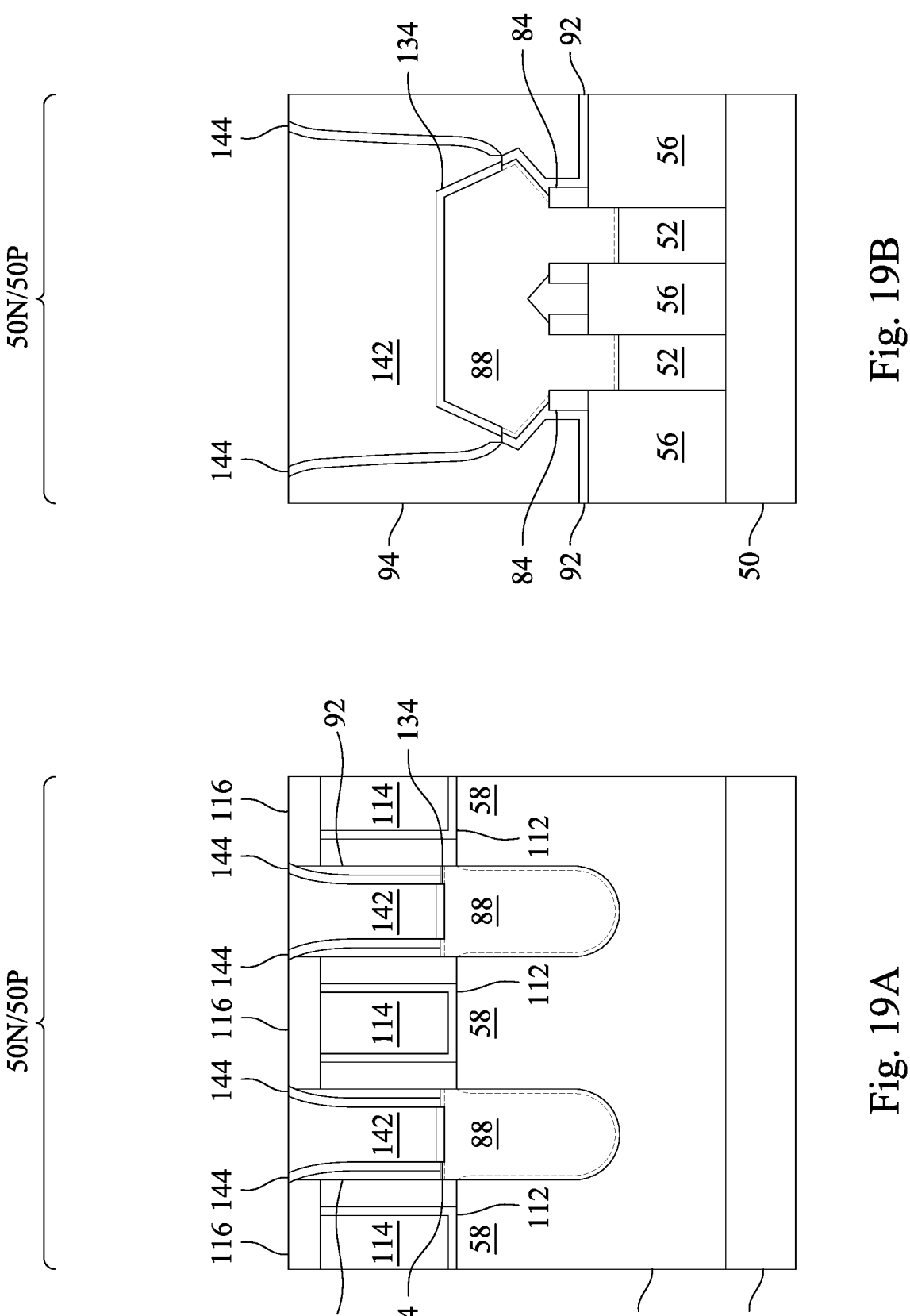

In FIGS. 19A-19B, source/drain contacts 142 are formed in the contact openings 122. The source/drain contacts 142 are connected to the epitaxial source/drain regions 88, and physically contact the metal-semiconductor alloy regions 134. As an example to form the source/drain contacts 142, a liner (not separately illustrated), such as a diffusion barrier layer, an adhesion layer, or the like, and a conductive material can be formed in the contact openings 122 (e.g., on the metal-semiconductor alloy regions 134). The liner may include titanium, titanium nitride, tantalum, tantalum nitride, or the like. The conductive material may be copper, a copper alloy, silver, gold, tungsten, cobalt, aluminum, nickel, or the like. A removal process is performed to remove excess materials from the top surfaces of the gate masks 116. In some embodiments, a planarization process such as a chemical mechanical polish (CMP), an etch-back process, combinations thereof, or the like may be utilized. The remaining liner and conductive material form the source/drain contacts 142 in the contact openings 122.

Because the protective layer 132 protects the gate masks 116 and the CESL 92 during cleaning of the contact openings 122 (described for FIGS. 18A-18B), losses of the CESL 92 and/or the gate masks 116 may be avoided. Referring to the cross-section of FIG. 19A, the source/drain contacts 142 may thus have a similar funnel shape as the contact openings 122 (described for FIG. 14A), where the upper portions of the source/drain contacts 142 have curved sidewalls (e.g., tapered sidewalls), and the lower portions of the source/drain contacts 142 have substantially straight sidewalls (e.g., non-tapered sidewalls).

The removal process performed to remove excess materials of the source/drain contacts 142 also removes portions of the protective layer 132 from the top surfaces of the gate masks 116. The remaining protective layer 132 forms contact spacers 144 in the contact openings 122, around the source/drain contacts 142. The portions of the contact spacers 144 along the upper portions of the source/drain contacts 142 are curved, and the portions of the contact spacers 144 along the lower portions of the source/drain contacts 142 are straight. Depending on the selectivity of the removal processes, some losses of the gate masks 116 may occur, such that the gate masks 116 have a reduced height. In the illustrated embodiment, the contact spacers 144 extend along and physically contact the curved sidewalls of the remaining portions of the gate masks 116, and the curved sidewalls of the CESL 92. In another embodiment (described in greater detail below), the height of the gate masks 116 is reduced until the top surfaces of the gate masks 116 and the CESL 92 are coplanar (within process variation), so that the contact spacers 144 are physically separated from the sidewalls of the gate masks 116 by the CESL 92.

Figure 20B:
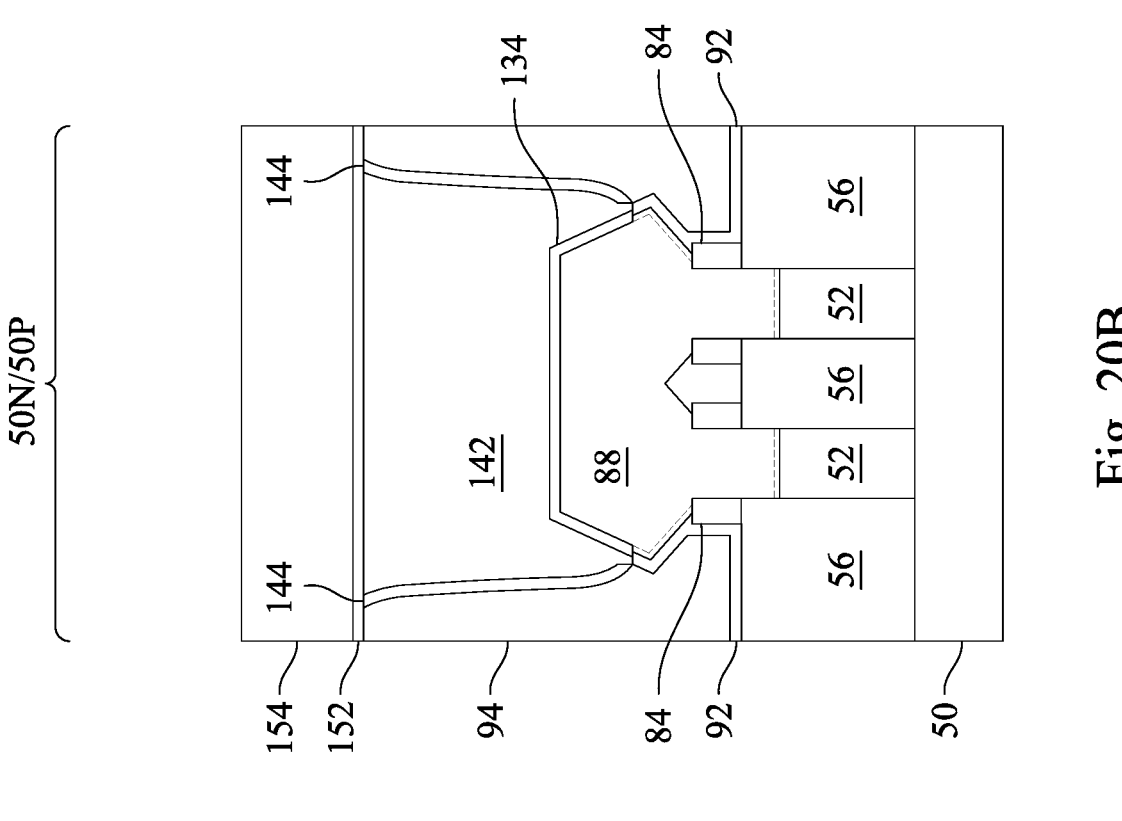
Figure 20A:
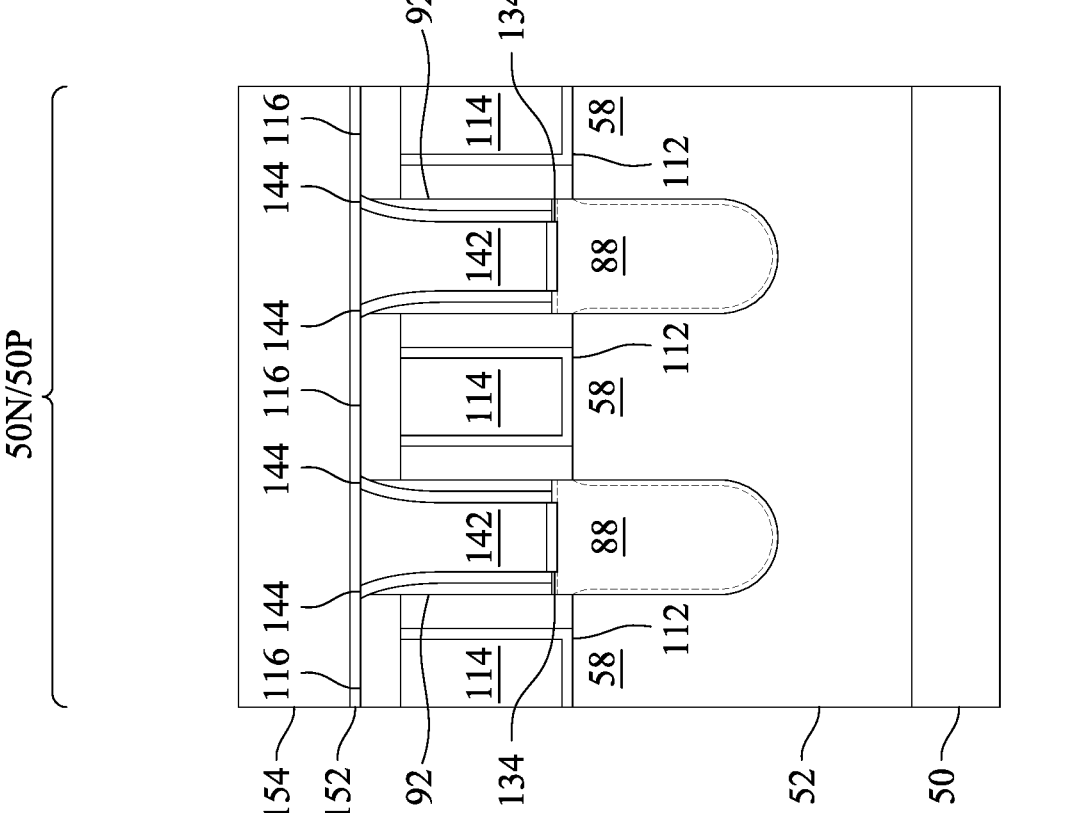

In FIGS. 20A-20B, a second ILD 154 is deposited over the first ILD 94, the gate masks 116, the source/drain contacts 142, and the contact spacers 144. In some embodiments, the second ILD 154 is a flowable film formed by a flowable CVD method. In some embodiments, the second ILD 154 is formed of a dielectric material such as PSG, BSG, BPSG, USG, or the like, which may be deposited by any suitable method, such as CVD, PECVD, or the like.

In some embodiments, an etch stop layer (ESL) 152 is formed between the second ILD 154 and the first ILD 94, the gate masks 116, the source/drain contacts 142, and the contact spacers 144. The ESL 152 may include a dielectric material, such as, silicon nitride, silicon oxide, silicon oxynitride, or the like, having a high etching selectivity from the etching of the second ILD 154.

Figures 21A, 21B:
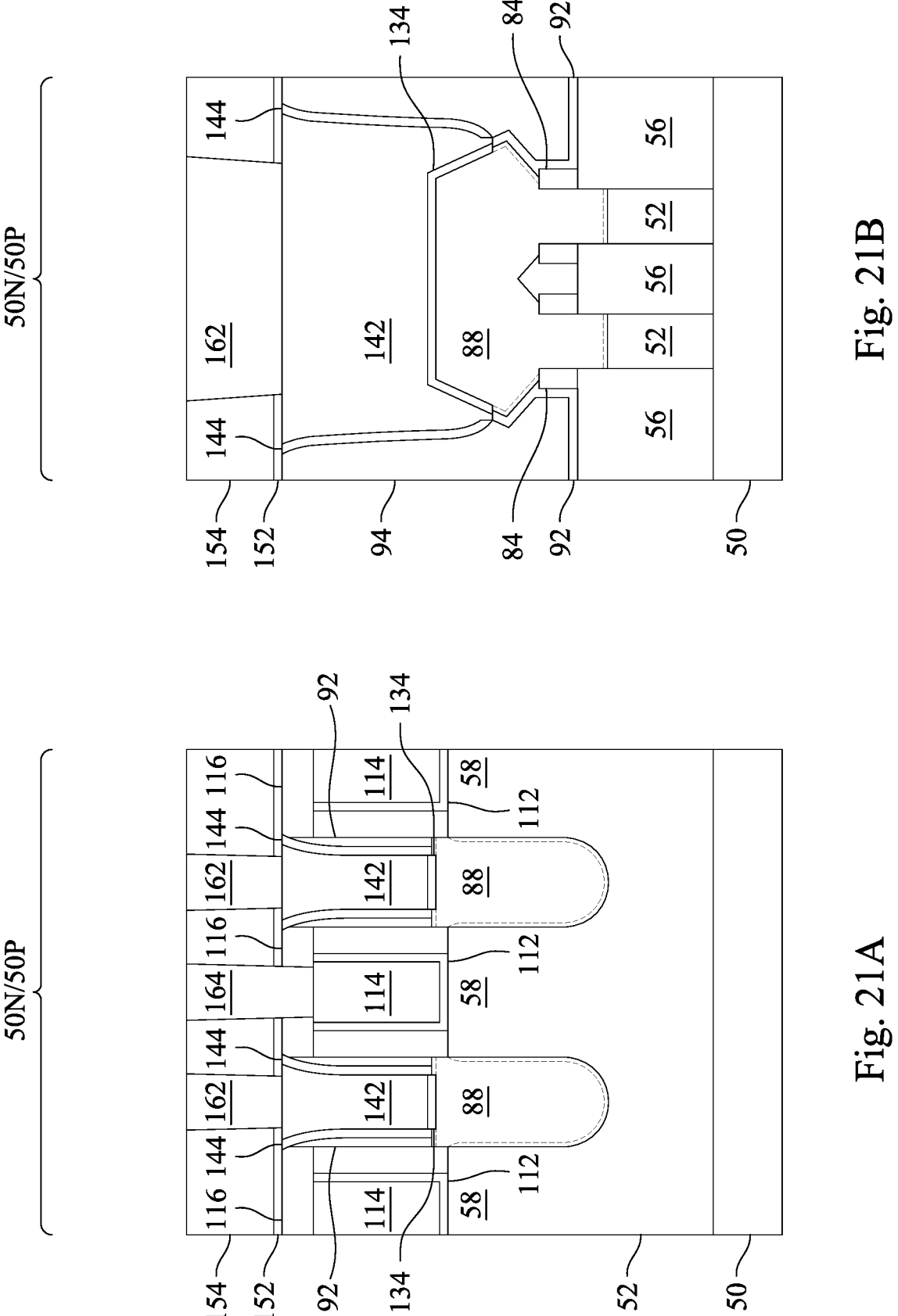

In FIGS. 21A-21B, source/drain contacts 162 and gate contacts 164 are formed to contact, respectively, the source/drain contacts 142 and the gate electrodes 114. The source/drain contacts 162 are physically and electrically coupled to the source/drain contacts 142. The gate contacts 164 are physically and electrically coupled to the gate electrodes 114.

As an example to form the source/drain contacts 162 and the gate contacts 164, openings are formed through the second ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the second ILD 154. The remaining liner and conductive material form the source/drain contacts 162 and the gate contacts 164 in the openings. The source/drain contacts 162 and the gate contacts 164 may be formed in distinct processes, or may be formed in the same process. Although shown as being formed in the same cross-sections, it should be appreciated that each of the source/drain contacts 162 and the gate contacts 164 may be formed in different cross-sections, which may avoid shorting of the contacts.

Figures 22A, 22B:
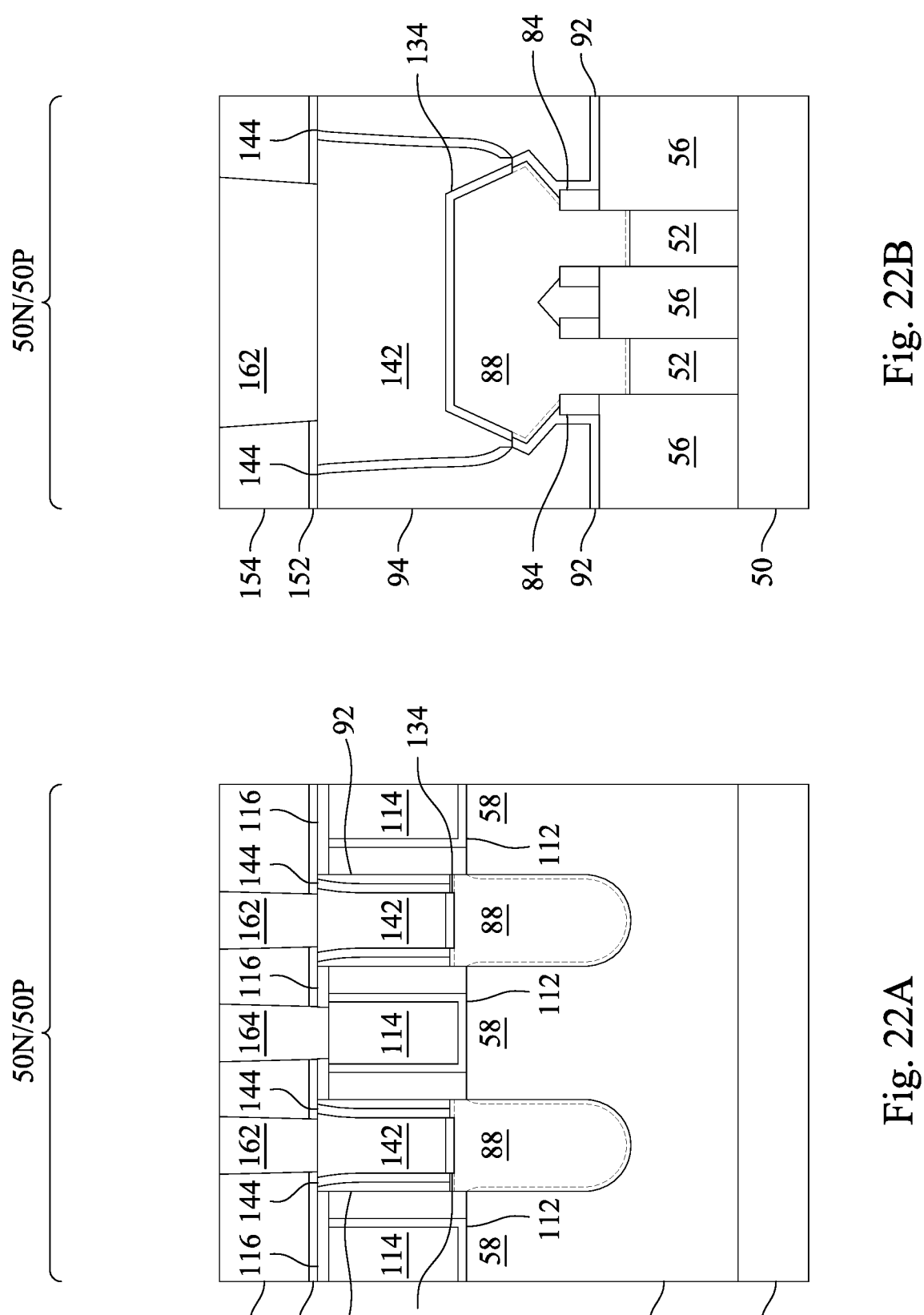
FIGS. 22A-22B are views of FinFETs, in accordance with some embodiments.

FIGS. 22A-22B are views of FinFETs, in accordance with some embodiments. This embodiment is similar to the embodiment of FIGS. 21A-21B, except the contact spacers 144 are physically separated from the sidewalls of the gate masks 116 by the CESL 92. Specifically, during the removal process performed to remove excess materials of the source/drain contacts 142, the height of the gate masks 116 is reduced until the top surfaces of the gate masks 116 and the CESL 92 are coplanar (within process variation), so that the contact spacers 144 are physically separated from the sidewalls of the gate masks 116 by the CESL 92.

Embodiments may achieve advantages. Initially forming the contact openings 122 to a smaller width and then expanding them to a larger width can avoid shorting of adjacent epitaxial source/drain regions 88, as compared to initially forming the contact openings 122 to a larger width. Further, forming the protective layer 132 helps protect the gate masks 116, the first ILD 94, and the CESL 92, so that undesired expansion of the contact openings 122 can be avoided during formation of the metal-semiconductor alloy regions 134. Shorting of the source/drain contacts 142 to adjacent conductive features may thus be avoided. Specifically, avoiding expansion of the contact openings 122 in the cross-section of FIG. 18A can reduce the risk of shorting between the source/drain contacts 142 and the gate electrodes 114 or the gate contacts 164. Likewise, avoiding expansion of the contact openings 122 in the cross-section of FIG. 18B can reduce the risk of shorting between adjacent source/drain contacts 142. Manufacturing yield may thus be improved. Finally, etching the protective layer 132 with an etchant such as carbonyl sulfide (COS) allows the source/drain contacts 142 to be formed to the main layers 88B (e.g., highly doped regions) of the epitaxial source/drain regions 88, while avoiding etching of the main layers 88B. Device performance may thus be improved.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a method includes: depositing a protective layer on a source/drain region and a gate mask, the gate mask disposed on a gate structure, the gate structure disposed on a channel region of a substrate, the channel region adjoining the source/drain region; etching an opening through the protective layer, the opening exposing the source/drain region; depositing a metal in the opening and on the protective layer; annealing the metal to form a metal-semiconductor alloy region on the source/drain region; and removing residue of the metal from the opening with a cleaning process, the protective layer covering the gate mask during the cleaning process. In some embodiments of the method, the cleaning process includes performing a wet etch using dilute hydrofluoric acid, and no etching of the gate mask occurs during the wet etch. In some embodiments of the method, the source/drain region includes a main layer and a finishing layer, and the method further includes: etching the opening through the finishing layer of the source/drain region, the opening exposing the main layer of the source/drain region. In some embodiments of the method, the protective layer includes silicon nitride, and etching the opening includes performing a dry etch using carbonyl sulfide. In some embodiments of the method, no etching of the main layer of the source/drain region occurs during the dry etch. In some embodiments of the method, the protective layer has a thickness in a range of 1 nm to 3 nm. In some embodiments, the method further includes: depositing a contact etch stop layer (CESL) on the source/drain region; forming an inter-layer dielectric (ILD) on the CESL; forming a contact opening through the ILD and the CESL; and after forming the contact opening, expanding the contact opening, the protective layer deposited in the contact opening after expanding the contact opening. In some embodiments of the method, expanding the contact opening includes etching the ILD with hydrogen fluoride and ammonia at room temperature.

In an embodiment, a method includes: depositing a contact etch stop layer (CESL) on a source/drain region; forming an inter-layer dielectric (ILD) on the CESL; forming a contact opening through the ILD and the CESL, the contact opening exposing a top surface of the source/drain region and a sidewall of the CESL; after forming the contact opening, expanding the contact opening by etching the ILD with an isotropic etching process; and forming a source/drain contact in the contact opening. In some embodiments of the method, the isotropic etching process includes: performing a dry etch with an etching gas solution in the contact opening, the dry etch performed without plasma, the etching gas solution converting the ILD to a solid phase byproduct; performing a thermal treatment to sublimate the solid phase byproduct to a gas phase byproduct; and evacuating the gas phase byproduct from the contact opening. In some embodiments of the method, the etching gas solution includes hydrogen fluoride and ammonia, and the dry etch is performed at room temperature. In some embodiments of the method, the etching gas solution includes hydrogen fluoride, and the dry etch is performed at a temperature in a range of 20° C. to 40° C. In some embodiments of the method, the dry etch is performed at a first temperature, and the thermal treatment is performed at a second temperature, the second temperature greater than the first temperature. In some embodiments of the method, the ILD includes silicon oxide, and the solid phase byproduct includes ammonium fluorosilicate. In some embodiments, the method further includes: forming a gate structure on a channel region of a substrate, the channel region adjoining the source/drain region; forming a gate mask on the gate structure; after expanding the contact opening, depositing a protective layer on the gate mask and in the contact opening; extending the contact opening through the protective layer; and forming a metal-semiconductor alloy region in the contact opening while the protective layer covers the gate mask. In some embodiments of the method, forming the metal-semiconductor alloy region includes performing a cleaning process, and no etching of the gate mask occurs during the cleaning process. In some embodiments of the method, extending the contact opening through the protective layer includes etching the contact opening with carbonyl sulfide.

In an embodiment, a device includes: a gate structure on a channel region of a substrate; a gate mask on the gate structure; a source/drain region adjoining the channel region; a source/drain contact connected to the source/drain region, the source/drain contact having an upper portion with curved sidewalls and having a lower portion with straight sidewalls; and a contact spacer around the source/drain contact, the contact spacer contacting a sidewall of the gate mask. In some embodiments, the device further includes: a gate spacer between the gate structure and the source/drain region; and a contact etch stop layer (CESL) between the gate spacer and the contact spacer, the CESL contacting the sidewall of the gate mask. In some embodiments, the device further includes: a metal-semiconductor alloy region between the source/drain region and the source/drain contact, the contact spacer contacting a sidewall of the metal-semiconductor alloy region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first inter-layer dielectric over a source/drain region;
etching an opening through the first inter-layer dielectric;
depositing a protective layer in the opening and over a gate mask, the gate mask disposed over a gate structure, the gate structure disposed over a channel region, the channel region adjoining the source/drain region;
extending the opening through the protective layer, the opening exposing the source/drain region;
forming a metal-semiconductor alloy region in the opening, the protective layer covering the gate mask during the forming the metal-semiconductor alloy region;
forming a source/drain contact over the metal-semiconductor alloy region;
removing the protective layer from over the gate mask;
after removing the protective layer, forming a second inter-layer dielectric over the gate mask and the first inter-layer dielectric; and
forming a gate contact through the second inter-layer dielectric and the gate mask.
2. The method of claim 1, wherein forming the metal-semiconductor alloy region comprises:
depositing a metal in the opening and over the protective layer;
annealing the metal; and
removing residue of the metal from the opening with a cleaning process.
3. The method of claim 2, wherein the cleaning process comprises performing a wet etch using dilute hydrofluoric acid, and no etching of the gate mask occurs during the wet etch.
4. The method of claim 1, further comprising:
etching the opening through a finishing layer of the source/drain region, the opening exposing a main layer of the source/drain region.
5. The method of claim 4, wherein the protective layer comprises silicon nitride, and etching the opening comprises performing a dry etch using carbonyl sulfide.
6. The method of claim 5, wherein no etching of the main layer occurs during the dry etch.
7. The method of claim 4, wherein the main layer has a greater concentration of impurities than the finishing layer.
8. The method of claim 1, further comprising:
before depositing the protective layer, expanding the opening to form an expanded contact opening, the protective layer being deposited in the expanded contact opening.
9. A method comprising:
forming an inter-layer dielectric over a source/drain region, the source/drain region formed in a fin;
forming a contact opening through the inter-layer dielectric, the contact opening exposing the source/drain region;
expanding the contact opening, a first width of the contact opening in a first cross-section being increased, a second width of the contact opening in a second cross-section remaining unchanged, the second cross-section being along a longitudinal axis of the fin, the first cross-section being perpendicular to the second cross-section, the first width and the second width being of the same portion of the contact opening; and
forming a source/drain contact in the contact opening.

10. The method of claim 9, wherein expanding the contact opening comprises:

performing a dry etch in the contact opening, the dry etch performed without plasma, the dry etch converting the inter-layer dielectric to a solid phase byproduct;

performing a thermal treatment to sublimate the solid phase byproduct to a gas phase byproduct; and evacuating the gas phase byproduct from the contact opening.

11. The method of claim 10, wherein the dry etch is performed with hydrogen fluoride and ammonia, and the dry etch is performed at room temperature.

12. The method of claim 10, wherein the dry etch is performed with hydrogen fluoride, and the dry etch is performed at a temperature in a range of 20° C. to 40° C.

13. The method of claim 10, wherein the dry etch is performed at a first temperature, the thermal treatment is performed at a second temperature, and the second temperature is greater than the first temperature.

14. The method of claim 10, wherein the inter-layer dielectric comprises silicon oxide, and the solid phase byproduct comprises ammonium fluorosilicate.

15. The method of claim 9, further comprising:

forming a gate structure over a channel region, the channel region adjoining the source/drain region;

forming a gate mask over the gate structure;

depositing a protective layer over the gate mask; and forming a metal-semiconductor alloy region in the contact opening while the protective layer covers the gate mask.

16. The method of claim 15, wherein forming the metal-semiconductor alloy region comprises performing a cleaning process, and no etching of the gate mask occurs during the cleaning process.

17. The method of claim 9, wherein expanding the contact opening comprises etching the inter-layer dielectric with an isotropic etching process that selectively etches a material of the inter-layer dielectric at a faster rate than a material of the source/drain region.

18. A method comprising:

forming a contact opening through an inter-layer dielectric, the contact opening exposing a top surface of a source/drain region, the source/drain region formed in a fin;

forming an expanded contact opening by expanding the contact opening in a cross-section that is perpendicular to a longitudinal axis of the fin;

depositing a protective layer in the expanded contact opening and over a gate mask, the gate mask adjacent the source/drain region;

extending the expanded contact opening through the protective layer; and forming a metal-semiconductor alloy region in the expanded contact opening while the protective layer covers the gate mask.

19. The method of claim 18, wherein the inter-layer dielectric comprises silicon oxide, and expanding the contact opening comprises performing a dry etch using hydrogen fluoride and ammonia without plasma.

20. The method of claim 18, wherein the protective layer comprises silicon nitride, and extending the expanded contact opening through the protective layer comprises performing a dry etch using carbonyl sulfide.

* * * * *